United States Patent [19]
Miyatake

[11] Patent Number: 6,046,508
[45] Date of Patent: Apr. 4, 2000

[54] POSITION DETECTING METHOD WITH OBSERVATION OF POSITION DETECTING MARKS

[75] Inventor: Tsutomu Miyatake, Kiyose, Japan

[73] Assignee: Sumitomo Heavy Industries, Ltd., Tokyo, Japan

[21] Appl. No.: 09/107,954

[22] Filed: Jun. 30, 1998

Related U.S. Application Data

[62] Division of application No. 08/640,170, Apr. 30, 1996, Pat. No. 5,827,629.

[30] Foreign Application Priority Data

| | | | |
|---|---|---|---|
| May 11, 1995 | [JP] | Japan | 7-113281 |
| May 19, 1995 | [JP] | Japan | 7-121659 |
| Sep. 1, 1995 | [JP] | Japan | 7-225165 |
| Nov. 13, 1995 | [JP] | Japan | 7-294485 |

[51] Int. Cl.$^7$ ............................................. H01L 23/544
[52] U.S. Cl. ............................................. 257/797
[58] Field of Search ............................................. 257/797

[56] References Cited

U.S. PATENT DOCUMENTS

| | | | |
|---|---|---|---|
| 3,660,157 | 5/1972 | Villers et al. | 117/212 |
| 4,165,178 | 8/1979 | Coumo, Jr. et al. | 356/1 |
| 4,390,279 | 6/1983 | Suwa | 356/401 |
| 4,547,446 | 10/1985 | Tam | 430/22 |
| 4,728,193 | 3/1988 | Bartelt et al. | 356/356 |
| 4,938,598 | 7/1990 | Akiyama et al. | 356/375 |
| 5,473,166 | 12/1995 | Imai et al. | 250/548 |
| 5,682,242 | 10/1997 | Eylon | 356/401 |
| 5,969,428 | 10/1999 | Nomura et al. | 257/797 |

OTHER PUBLICATIONS

"Impact of Different X–Ray Mask Substrate Materials on Optical Alignment", R.I. Fuentes, C. Progler, S. Bukofsky and K. Kimmel, J. Vac. Sci. Technol. B 10(6), Nov./Dec. 1992, pp. 3204–3207.

*Primary Examiner*—Gene M. Munson
*Attorney, Agent, or Firm*—Frishauf, Holtz, Goodman, Langer & Chick, P.C.

[57] ABSTRACT

A wafer with an exposure surface and an exposure mask are disposed, directing the exposure surface to the exposure mask with a gap being interposed therebetween, the wafer having a position aligning wafer mark formed on the exposure surface, the wafer mark having a linear or point scattering source for scattering incident light, and the exposure mask having a position aligning mask mark having a linear or point scattering source for scattering incident light. A relative position of the wafer and exposure mask is detected by applying illumination light to the wafer mark and mask mark and observing scattered light from the scattered sources of the wafer mark and mask mark.

5 Claims, 19 Drawing Sheets

FIG.9D1
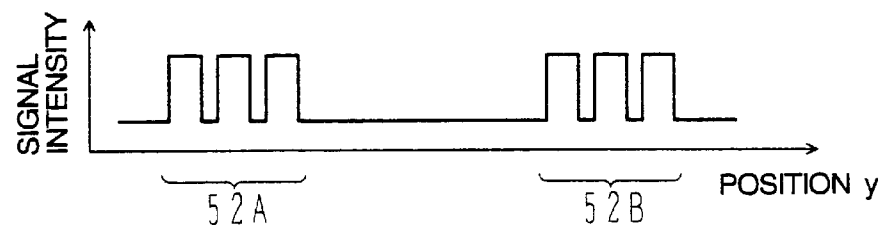
FIG.9D2
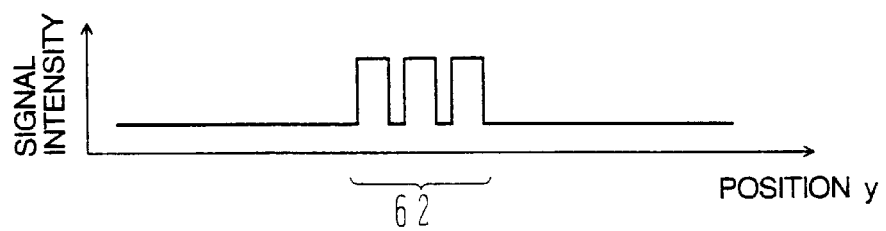
FIG.9D3
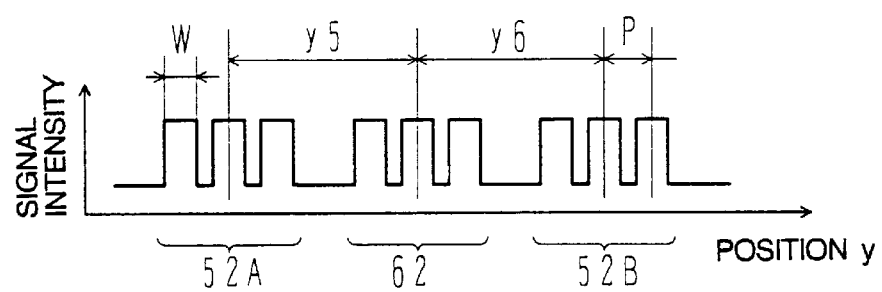
FIG.9E
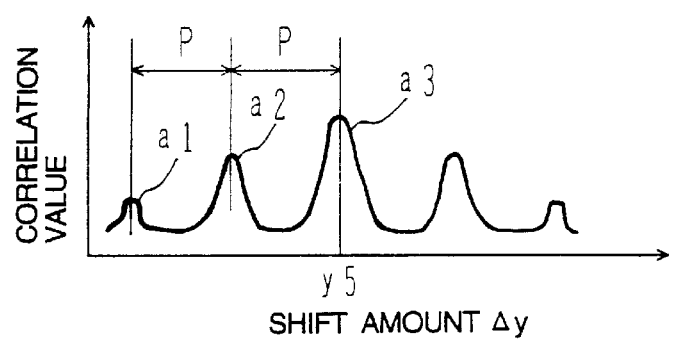

POSITION DETECTING METHOD WITH OBSERVATION OF POSITION DETECTING MARKS

This is a division of application Ser. No. 08/640,170 filed Apr. 30, 1996, now U.S. Pat. No. 5,827,629.

BACKGROUND OF THE INVENTION a) Field of the Invention

The present invention relates to a method of detecting a relative position of a mask and a wafer, and to a position detecting mark (an alignment mark). More particularly, the invention relates to a position detecting method (an alignment method) suitable for improving throughput of proximity exposure, and to a position detecting mark.

b) Description of the Related Art

A vertical detection method and an oblique detection method are known as a method of detecting the positions of a wafer and a mask by using an aligner having a lens system combined with an image processing system. The vertical detection method observes an alignment mark along a direction perpendicular to the mask plane, and the oblique detection method observes it obliquely.

A chromatic bifocal method is known as a focussing method used by the vertical detection method. The chromatic bifocal method observes alignment marks formed on a mask and a wafer by using light of different wavelengths and chromatic aberrations of the lens system, and focuses the images of the masks on the same flat plane. An absolute precision of position detection by the chromatic bifocal method can be made high because the optical resolution of the lens system can be set high in principle.

However, since an alignment mark is observed vertically, a part of the optical system enters the exposure area. Since the optical system shields exposure light, it is necessary to retract the optical system from the exposure area when exposure light is applied. A time required for retracting the optical system lowers throughput. The alignment mark cannot be observed during the exposure, which is one of the reasons of lowering an alignment precision during the exposure.

With the oblique detection method, the optical axis of the optical system is disposed obliquely to the mask plane, and the system can be disposed without shielding the exposure system. It is therefore unnecessary to extract the optical system during exposure, permitting observation of an alignment mark even during the exposure. Therefore, throughput does not lower and position misalignment during the exposure can be prevented.

A conventional oblique detection method uses oblique focussing in which regular reflection light reflected from the mark is obliquely focussed to detect the image of the mark. An absolute precision of position detection is therefore lowered by image distortion. Furthermore, since regular reflection light is incident to an observation lens, the optical axis of illumination light cannot coincide with the optical axis of observation light. Since the optical axes of illumination and observation light are required to be separated, if there is even a slight shift between both the axes, the detection precision is lowered and the installation of the optical system becomes complicated.

SUMMARY OF THE INVENTION

It is an object of the present invention to provide an alignment method capable of detecting a position with high alignment precision even during exposure and without lowering throughput.

It is another object of the present invention to provide a semiconductor substrate and an exposure mask having alignment marks, capable of detecting a position with high alignment precision even during exposure and without lowering throughput.

According to one aspect of the present invention, there is provided a method of detecting a position, comprising the steps of: disposing a wafer with an exposure surface and an exposure mask, directing the exposure surface to the exposure mask with a gap being interposed therebetween, the wafer having a position aligning wafer mark formed on the exposure surface, the wafer mark having a linear or point scattering source for scattering incident light, and the exposure mask having a position aligning mask mark having a linear or point scattering source for scattering incident light; and detecting a relative position of the wafer and the exposure mask by applying illumination light to the wafer mark and the mask mark and observing scattered light from the scattered sources of the wafer mark and the mask mark.

Generally, if the illumination and observation axes are made coaxial and the axes are set obliquely to the exposure plane, regular reflection light from the wafer mark and mask mark does not return along the observation optical axis. Therefore, the images of these marks cannot be observed. Regular reflection means a reflection that if parallel light fluxes are applied, reflected light is also parallel and that the incident angle and reflection angle are the same. If scattering sources for scattering incident light are formed on the wafer mark and mask mark, light fluxes among scattered light fluxes in the aperture of an object lens of the observation optical system form an image so that scattered light can be observed.

According to another aspect of the present invention, there is provided a semiconductor substrate comprising: an exposure plane formed with a position aligning wafer mark having a plurality of edge type or point type scattering sources for scattering incident light, the scattering sources being disposed in the direction perpendicular to the plane of incidence of the incident light.

According to a further aspect of the present invention, there is provided an exposure mask comprising: a position aligning mask mark having a plurality of edge type or point type scattering sources for scattering incident light, the scattering sources being disposed in the direction perpendicular to the plane of incidence of the incident light.

If a plurality of scattering sources of the wafer mark and mask mark are disposed in a direction perpendicular to the incidence plane, images of scattered light from a plurality of scattering sources can be formed at the same time. If a position is detected by observing at the same time the images of scattered light from the plurality of scattering sources, a position detection error to be caused by a variation of the shapes of each scattering source at the manufacture processes can be reduced.

BRIEF DESCRIPTION OF THE DRAWINGS

FIG. 9D1–9D3 are diagrams showing image signals of images of edge scattering light.

FIG. 9E is a graph showing a correlation function of the image signal shown in FIG. 9D3.

DETAILED DESCRIPTION OF THE PREFERRED EMBODIMENTS

First, edge scattering light to be observed by the embodiments of the invention will be described with reference to FIG. 1.

Figure 1:
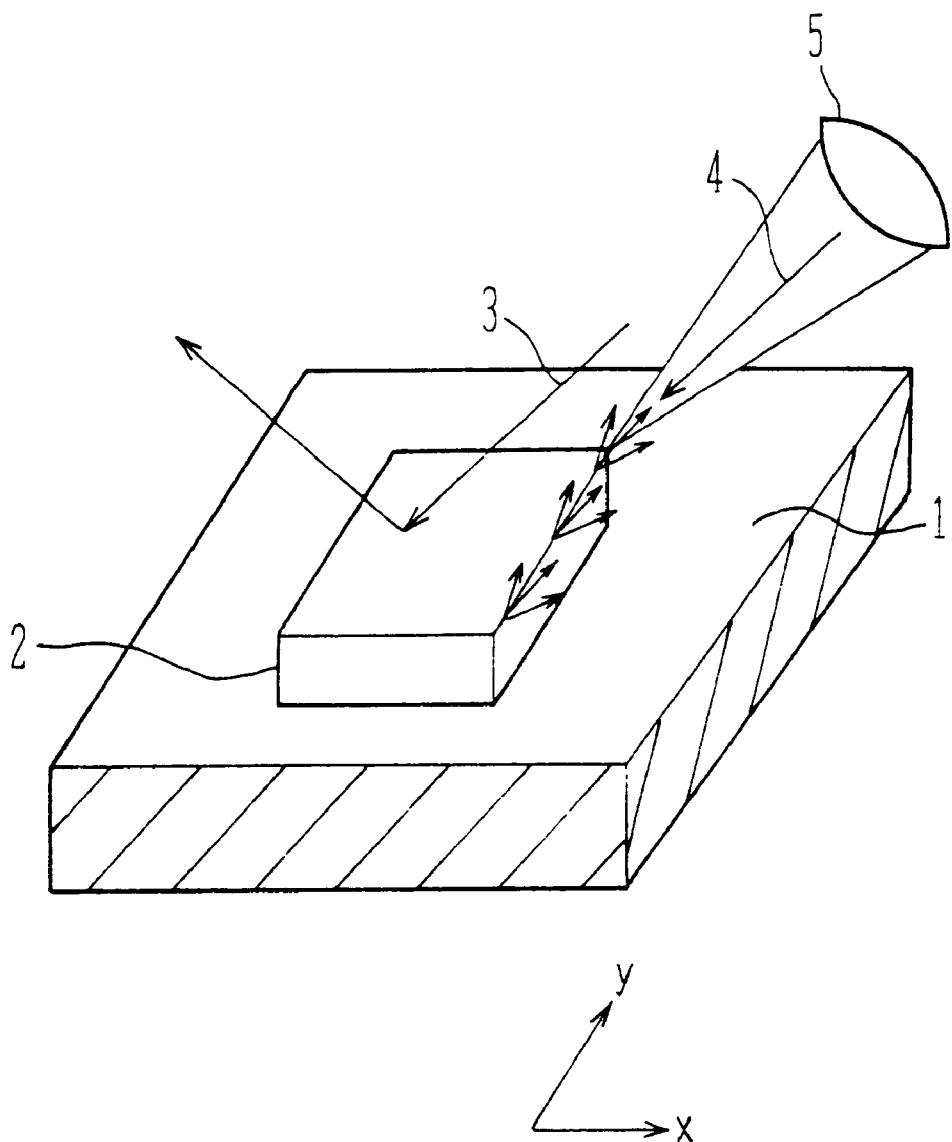
FIG. 1 is a perspective view of a wafer illustrating reflection from a wafer mark, and edge scattering light.

FIG. 1 is a perspective view of a position alignment wafer mark formed on the wafer surface 1. A projection 2 of a rectangular surface shape is formed on the wafer surface 1. Consider the coordinate system having an x-axis and a y-axis parallel to respective sides of the rectangle. As illumination light having an incidence plane perpendicular to the y-axis is obliquely applied to the wafer surface 1, light 3 incident to the mirror area of the projection 2 such as a top flat surface is regularly reflected, whereas light 4 incident to the edge portion is scattered. In this specification, a regular reflection means a reflection that as parallel light fluxes are applied, reflected light fluxes are also parallel and that the incidence angle is equal to the reflection angle.

Consider now that the wafer surface 1 is observed with an optical system having an object lens 5 whose optical axis is coaxial with the incidence optical axis. Light regularly reflected from the upper flat surface or the like of the projection 2 is not incident to the object lens 5 and an image of the wafer mark is not focussed by regular reflection light. In contrast, light scattered from an edge is radiated omnidirectionally, and part of the scattered light beams is incident to the object lens. Therefore, this scattered light can be observed in the same direction as the incidence direction of illumination light. In one type of embodiments of the invention, the position of a wafer is detected through observation of light scattered from an edge.

Figure 2A:
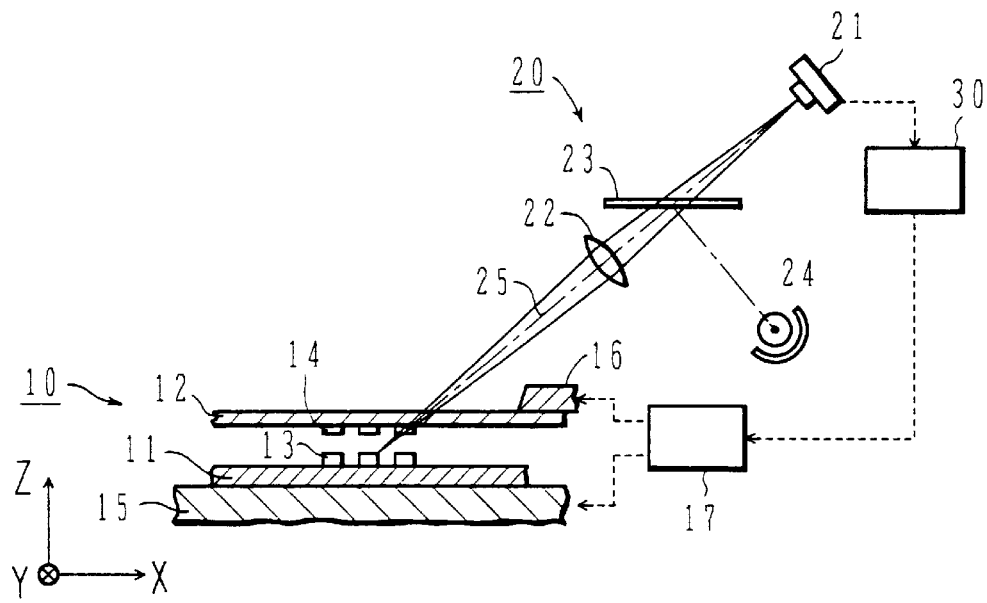
FIG. 2A is a schematic cross sectional view of a position detection apparatus used by embodiments of the invention.

FIG. 2A is a schematic cross sectional view of a position detection apparatus used by the embodiments of the invention. The position detection apparatus is structured by a wafer/mask holding unit 10, an optical system 20, and a controller 30.

The wafer/mask holding unit 10 is constituted by a wafer holder 15, a mask holder 16, and a driver mechanism 17. For position alignment, a wafer 11 is held on the top surface of the wafer holder 15, and a mask 12 is held on the bottom surface of the mask holder 16. The wafer 11 and mask 12 are disposed in parallel, forming a constant gap between the exposure surface of the wafer 11 and the bottom surface (mask surface) of the mask 12. Position alignment wafer marks 13 are formed on the exposure surface of the wafer 11, and a position alignment mask mark 14 is formed on the mask surface of the mask 12. The wafer marks and mask mark are collectively called alignment marks hereinafter.

The wafer marks 13 and mask mark 14 have edges from which incident light is scattered. If light beams incident to these marks, the light incident to the edge is scattered and the light incident to other areas is regularly reflected.

The drive mechanism 17 can generate a relative motion between the wafer holder 15 and mask holder 16. Taking an X-axis along the direction from the left to right in FIG. 2A, a Y-axis along the direction perpendicular to the drawing sheet from the front side to back side thereof, and a Z-axis along the direction normal to the exposure surface, then a relative motion between the wafer 11 and mask 12 can be realized in the X-, Y-, and Z-directions and in the rotation direction ($\theta_Z$ direction) about the Z-axis. A relative motion can be realized also in the rotation directions ($\theta_X$ and $\theta_Y$ directions) about the X- and Y-axes.

The optical system 20 is structured by an image detector 21, a lens 22, a half mirror 23, and a light source 24.

The optical axis 25 of the optical system 20 is obliquely set relative to the exposure surface. Illumination light radiated from the light source 24 is reflected by the half mirror 23, propagates as light fluxes along the optical axis 25, and are obliquely applied via the lens 22 to the exposure surface. The light source 24 is disposed at the focal point on the image side of the lens 22 so that the illumination light radiated from the light source 24 is collimated by the lens 22 and transformed into parallel light fluxes. The light source 24 is adapted to adjust the intensity of illumination light.

Of light scattered at the edges of the wafer marks 13 and mask mark 14, light incident to the lens 22 is converged by the lens 22 and focussed on the light reception surface of the image detector 21. In this optical system 20, therefore, illumination is telecentric illumination and the illumination and observation optical axes are the same optical axis.

The image detector 21 photoelectrically converts the images of wafer and mask marks focussed on the light reception plane into image signals. The image signals are inputted to the controller 30.

The controller 30 processes image signals supplied from the image detector 21 to detect a relative position of the wafer marks 13 and mask mark 14 in the direction of Y axis. The controller 30 sends control signals to the driver mechanism 17 so as to make the wafer marks 13 and mask mark 14 have a predetermined relative position. In response to this control signal, the drive mechanism 17 moves the wafer holder 15 or mask holder 16.

Figure 2B:
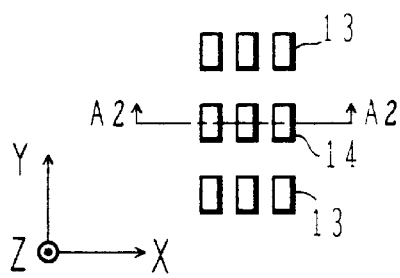
FIG. 2B is a plan view of wafer marks and a mask mark.

FIG. 2B is a plan view showing the relationship of a relative position between the wafer marks 13 and mask mark 14. Three rectangular patterns each having four sides in parallel with the X- or Y-axis are disposed in the X-axis direction, forming one mark. One mark may be constituted by four or more rectangular patterns as will be later described. The mask mark 14 is interposed between a pair of wafer marks 13.

The wafer marks 13 and mask mark 14 have the cross section shown in FIG. 2A taken along one-dot-chain line A2—A2 in FIG. 2B. Illumination light incident to the wafer marks 13 and mask mark 14 is scattered at edges of the rectangular patterns of FIG. 2B facing the optical axis. Light radiated to the areas other than the edges is regularly reflected and does not enter the lens 22. Therefore, the image detector 21 can detect only the light scattered by the edges and entered the lens 22.

Next, the nature of an image formed by edge scattered light will be described.

The light intensity distribution I of an image formed by incoherent monochrome light is given by:

$$I(x, y) = \int\int O(x-x', y-y') PSF(x', y') dx' dy' \quad (1)$$

where O(x, y) represents an intensity distribution of light reflected from the surface of an observation object, PSF(x, y) represents a point spread function of the lens, and the integration is performed for the whole surface of the observation object.

Each edge of the rectangular pattern shown in FIG. 2B can be considered as a series of fine points disposed in parallel with the Y-axis from which light is reflected. A reflected light intensity distribution of each fine point is assumed to be the Dirack delta function $\delta$. The intensity distribution of light scattered from a fine point can be approximated to the delta function in practice. Assuming that the edge extends in the Y-axis direction within the range satisfying the isoplanatism of the lens, then $O(x, y)=\delta(x)$ The equation (1) can be transformed into:

$$I(x) = \int\int \delta(x-x') PSF(x', y') dx' dy' \quad (2)$$
$$= \int PSF(x, y') dy'$$

wherein I(x) is a line spread function of the lens and can be written by:

$$I(x)=LSF(x) \quad (3)$$

where LSF(x) represents a line spread function of the lens.

If illumination light has continuous spectra, I(x) is given by:

$$I(x)=\int LSF\lambda(x-\Delta x\lambda) d\lambda \quad (4)$$

where $\lambda$ represents a wavelength of light, LSF$\lambda$ represents a line spread function at the wavelength $\lambda$, $\Delta x\lambda$ represents a lateral shift amount of a line image caused by the lens chromatic aberration at the wavelength $\lambda$, and the integration is performed for the whole wavelength range.

It can be understood from the equation (4) that observing light scattered from an edge is equivalent to observing the line spread function of the lens. Therefore, a stable image can be obtained through observation of light scattered from an edge, without being affected by the in-plane intensity distribution of light reflected from the observation object.

Figure 2D:
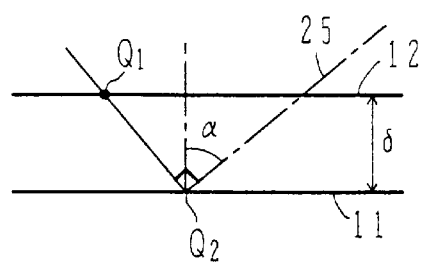
FIG. 2D is a cross sectional view showing the wafer and mask surfaces near the object surface.
Figure 2C:
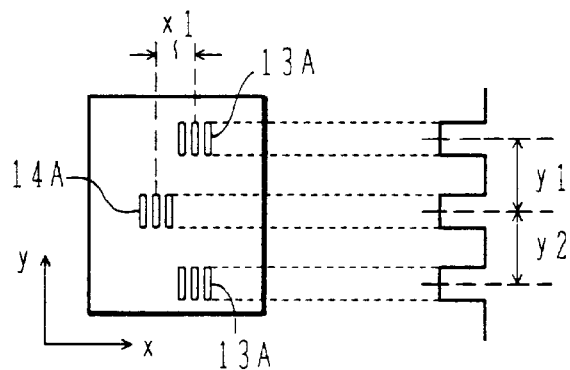
FIG. 2C is a diagram showing images formed by edge scattering light from wafer and mask marks, and a light intensity distribution in image-plane.

The left side of FIG. 2C shows the images focussed on the light reception plane of the image detector 21 of FIG. 2A. Taking the direction of intersecting the incidence plane including the observation optical axis with the light reception plane as the x-axis and the direction perpendicular to the x-axis in the light reception plane as the y-axis, an image of one edge becomes a straight line shape in parallel to the y-axis. Therefore, the image of each mark has three straight line shapes in parallel to the y-axis and disposed in the x-axis direction.

Between a pair of images 13A formed by light scattered at the edges of the wafer marks 13, an image 14A is formed by light scattered at the edges of the mask mark 14. Since the observation optical axis is oblique to the exposure plane, the wafer mark images 13A and mask mark image 14A are detected at different positions along the x-axis direction. The right side of FIG. 2C shows an intensity distribution of images of wafer marks 13A and mask mark 14A along the y-axis direction. The distance between the center of one of the wafer mark images 13A and the center of the mask mark image 14A in the y-axis direction is represented by y1, and the distance between the center of the other of the wafer mark images 13A and the center of the mask mark image 14A in the y-axis direction is represented by y2. Through the measurements of the distances y1 and y2, the relationship of a relative position in the y-axis between the wafer marks 13 and mask mark 14 can be known.

For example, if the mask mark is to be centered between a pair of wafer marks in the y-axis direction, one of the wafer and mask is moved relative to the other to make y1 be equal to y2. In this manner, position alignment in the Y-axis illustrated in FIG. 2B can be achieved. By preparing three sets of position alignment marks and the optical system shown in FIGS. 2A and 2B, position alignment in the X- and Y-axis directions and in the θ direction can be achieved. In FIG. 2A, the optical axes of illumination and observation light are made coaxial. The coaxial arrangement is not necessarily required, but other arrangements are possible if regular reflection light does not enter the object lens of the observation optical system and only scattered light enters the object lens.

Next, a method of measuring a gap between the exposure plane and mask plane will be described. An object point focussed on the light reception plane of the image detector 21 is on the plane perpendicular to the optical axis in the object space of the optical system 20. This plane is called hereinafter an "object surface".

Of the edges of wafer and mask marks, the edge on the object surface becomes in focus on the light reception plane. However, the edge not on the object surface becomes more out of focus as it moves apart from the object surface. Therefore, of the edges of each mark, the image on the object surface becomes clearest, and the image becomes more out of focus at the position further away in the x-axis direction. In this case, the image of the edge on the object surface is not an obliquely focussed image but a vertically focussed image.

In FIG. 2C, a distance x1 corresponds to a distance in the x-axis direction between the wafer mark image 13A on the object surface and the mask mark image 14A on the object surface. This distance x1 is generally equal to the distance between the points which are obtained by virtically projecting the images on the image surface corresponding to the wafer mark and the mask mark on the object surface onto the plane of incidence.

FIG. 2D is a cross sectional view showing the incidence planes of the wafer surface 11 and mask surface 12 near the object surface. A point $Q_2$ is on a line intersecting the wafer surface 11 with the object surface, and a point $Q_1$ is on a line intersecting the mask surface 12 with the object surface. The line segment $Q_1$–$Q_2$ is equal to x1/N where N is a focussing magnification.

Representing the length of the line segment $Q_1$–$Q_2$ by $L(Q_1Q_2)$, the gap δ between the wafer surface 11 and mask surface 12 is given by:

$$\delta = L(Q_1Q_2) \times \sin(\alpha) \quad (5)$$

where α represents an angle between the normal direction of the wafer surface 11 and the optical axis 25. Therefore, the gap δ can be known by obtaining the length of the line segment $Q_1$–$Q_2$ from the measured distance x1 in FIG. 2C. In order to precisely know the gap δ, it is preferable to precisely measure the distance x1. To this end, the depth of focus of the lens is preferably shallow.

A proximity gap between the wafer surface 11 and mask surface 12 can be set to a desired value, by controlling the driver mechanism 17 in the Z-axis so as to make the measured value x1 become a target value of the distance x1 preset to the controller 30.

Next, a first embodiment will be described in which light scattered from a wafer mark is observed.

Figure 3A:
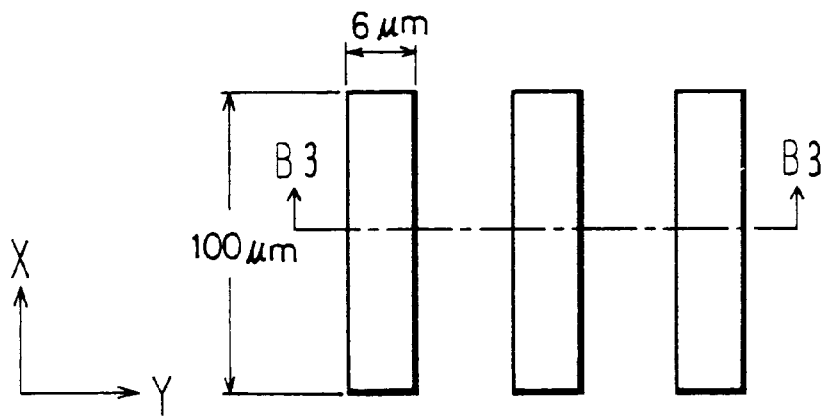
FIG. 3A is a plan view of a wafer mark used for observation experiments of edge scattering light.

FIG. 3A is a plan view of a wafer mark used by the first embodiment. A wafer mark is constituted by three rectangular patterns disposed in parallel. The width of the rectangular pattern is 6 μm and the length thereof is 100 μm. Each rectangular pattern is made of a step formed on the surface of a wafer, and has edges from which incident light is scattered. In the following, such a rectangular pattern having edges which scatter incident light, is called an edge pattern.

Figure 3B:
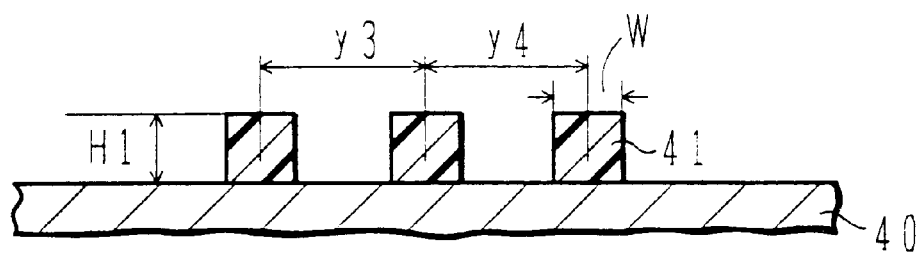
FIGS. 3B and 3C are cross sectional views of the wafer mark used for observation experiments of edge scattering light.
Figure 3C:
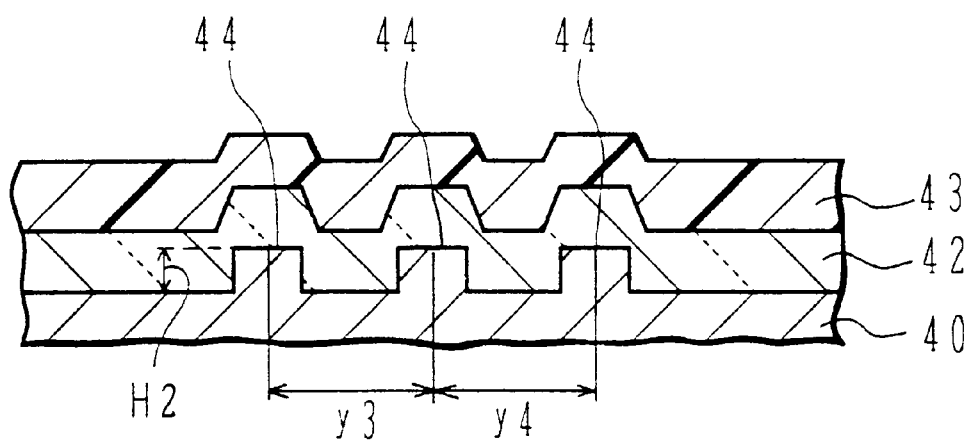

FIGS. 3B and 3C are cross sectional views taken along one-dot-chain line B3—B3 of FIG. 3A. In the case of the wafer shown in FIG. 3B, a resist pattern 41 (Microposit 2400 manufactured by Shipley Co.) is formed on the surface of a silicon substrate 40. The height H1 of the resist pattern 41 is 1.2 μm and the width W thereof is 6 μm.

The distances between the center line of the middle edge pattern and the center lines of edge patterns on both sides of the middle edge pattern are represented by y3 and y4. Ten types of wafer marks with y3–y4 being set to 0 nm, 20 nm, 40 nm, 60 nm, . . . , 180 nm were formed on the wafer used. The value y3–y4 is called hereinafter a shift amount of the middle edge pattern. Each mark has a value y3+y4 of 26 μm.

In the case of the wafer shown in FIG. 3C, silicon projections 44 are formed on a silicon substrate 40. The height H2 of the projection 44 is 0.5 μm. Covering the surface of the silicon substrate 40, a phosphosilicate glass (PSG) film 42 of 0.7 μm thick and a resist film 43 of 1.45 μm thick are stacked in this order. The width and interval of the projections 44 are the same as those of the resist patterns 41 shown in FIG. 3B.

Figure 4A:
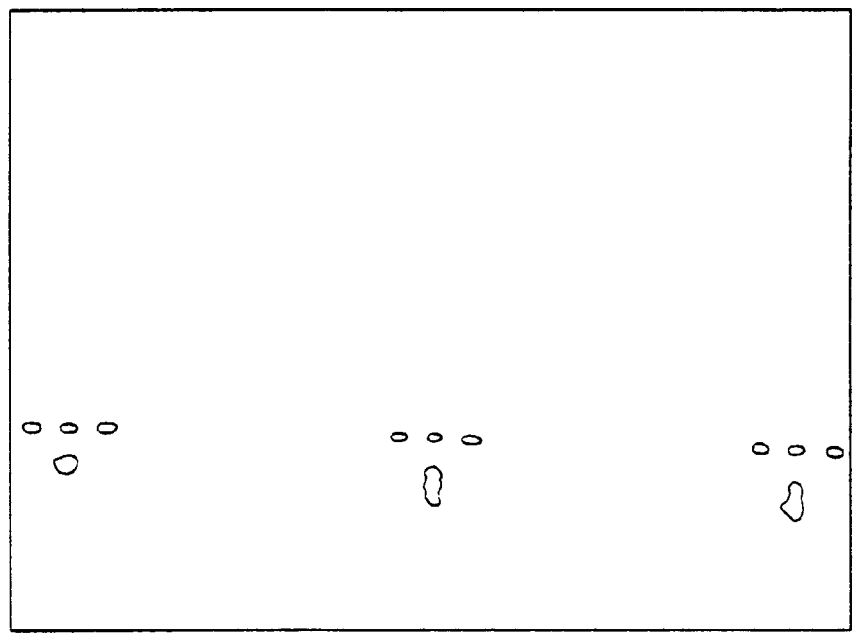
FIG. 4A is a diagram sketched from a photograph of an edge scattering light image of the wafer mark shown in FIG. 3B.

FIG. 4A shows images of wafer marks formed by the resist patterns shown in FIG. 3B, the image being obliquely observed as illustrated in FIG. 2A. A microscope used for the observation has an object lens with a numerical aperture NA of 0.4, and a detection magnification of 100. An optical system (coaxial observation/illumination optical system) having the observation optical axis coaxial with the illumination optical axis was used for the observation, in which the incidence plane of the illumination optical axis is in parallel to the longitudinal direction (X direction) of each edge pattern shown in FIG. 3A and the angle between the incidence plane and the normal to the wafer surface is 30 degrees. In the example shown in FIG. 4A, images of three wafer marks are observed. Each wafer mark has three juxtaposed line images which correspond to the images formed by light scattered from shorter sides of the edge patterns shown in FIG. 3A.

Images under the three juxtaposed line images (corresponding to the line spread function of the lens) are formed by edge scattering light from serial number marks formed under the wafer marks. The influence by the serial number mark images can be alleviated if the image detector scans laterally as viewed in FIG. 4A and detects the image signals only from the scan lines riding over the three juxtaposed line images.

Figure 4B:
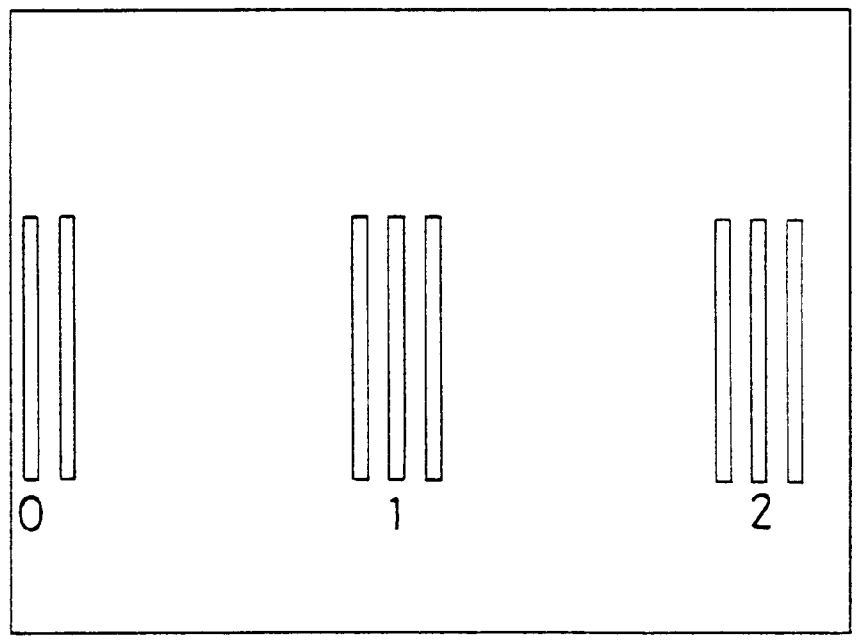
FIG. 4B is a diagram sketched from a photograph of a vertically detected image of the wafer mark shown in FIG. 3B.

FIG. 4B shows images of the wafer marks of resist patterns shown in FIG. 3B observed by a usual microscope along the normal direction of the exposure plane. In FIG. 4B, images for the three wafer marks are shown. The edge scattering light observed in FIG. 4A is generated at the shorter side edges of each wafer mark shown in FIG. 4B. The numerical mark under each mark is a serial number of the wafer mark.

Figure 5:
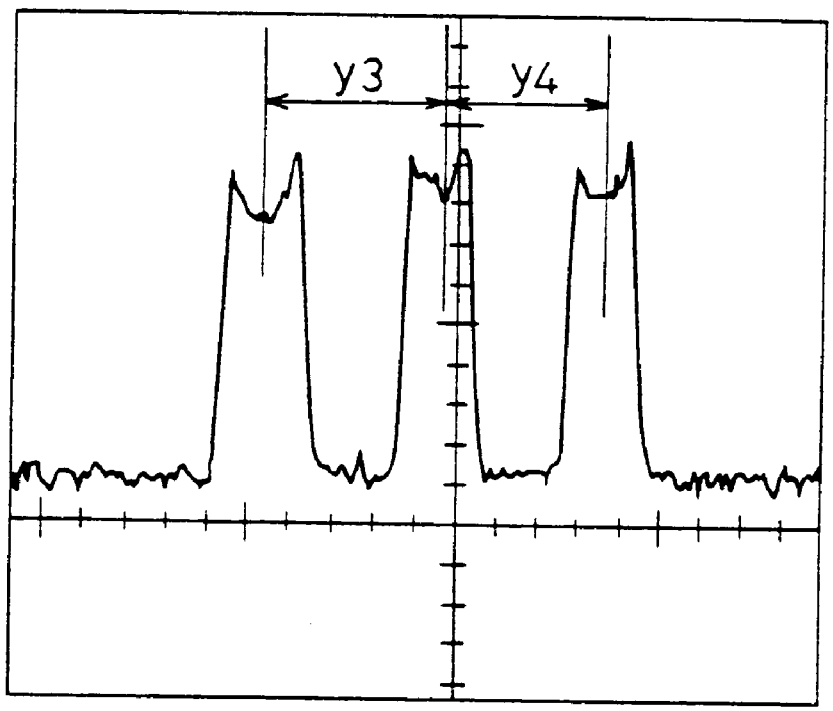
FIG. 5 is a diagram showing an image signal of an edge scattering light image of the wafer mark shown in FIG. 3B.

FIG. 5 shows an image signal of the line images formed by light scattered from the edges of the middle wafer mark shown in FIG. 4A. The abscissa represents a position on the wafer surface along the Y direction in FIG. 3A, and the ordinate represents a light intensity. Three sharp rectangular signals (peaks) appear in correspondence with the three line images. In this manner, an image signal representative of the rectangular signals (peaks) corresponding to the edge can be obtained by detecting the edge scattering light.

In FIGS. 4A, 4B, and 5, the images and image signal obtained by observing the wafer marks of resist patterns of FIG. 3B are shown. Similarly, also in the case of the wafer marks having a laminate structure shown in FIG. 3C, sharp images and a sharp image signal with a high S/N ratio were obtained.

Figure 6A:
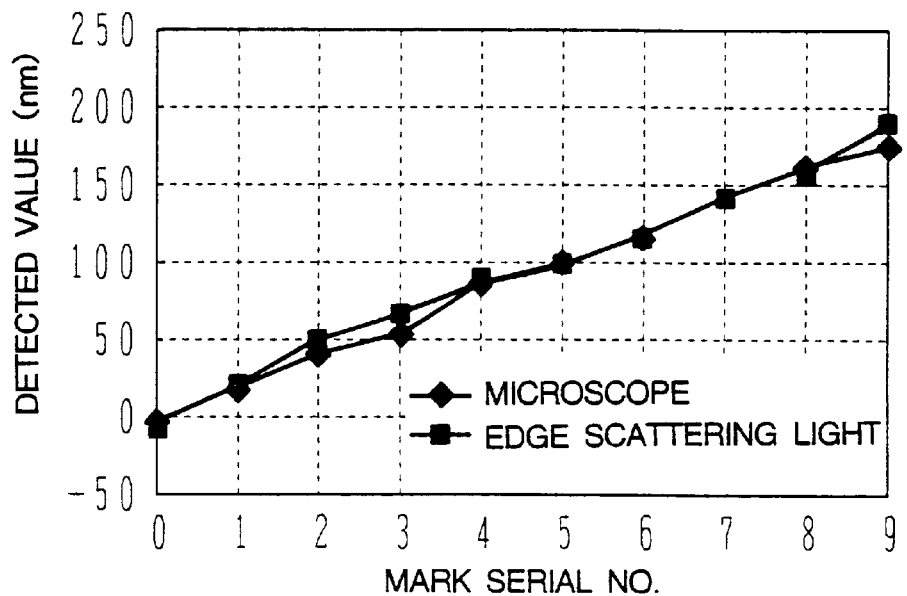
FIGS. 6A and 6B are graphs showing the results of displacement measurements through image signal processing.
Figure 6B:
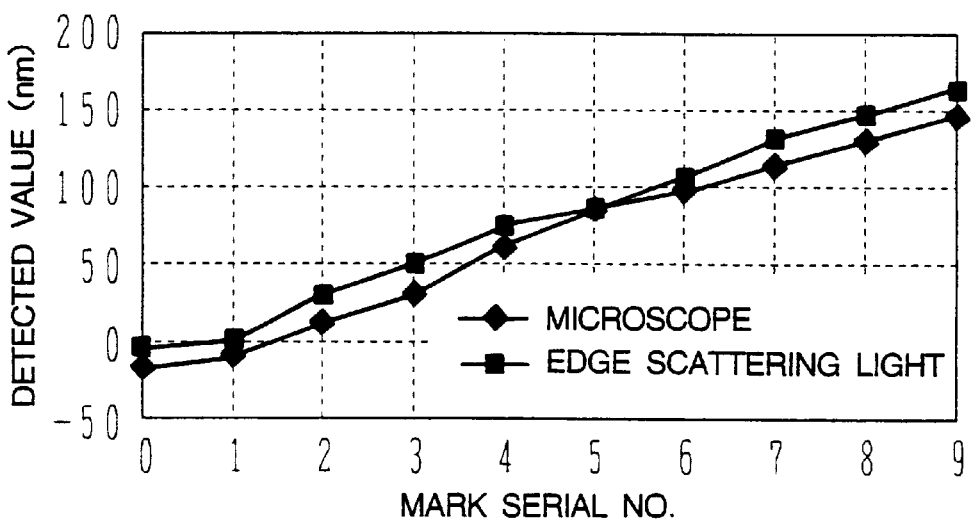

FIGS. 6A and 6B show the measurement results of the shift amounts y3−y4 of the middle edge patterns obtained through image signal processing. FIG. 6A uses the wafer marks of resist pattern shown in FIG. 3B, and FIG. 6B uses the wafer marks of the laminate structure shown in FIG. 3C. The abscissa represents a serial number of wafer marks. The shift amount y3−y4 of the wafer mark with the serial number n is n×20 nm. The ordinate represents the shift amount y3−y4 in the unit of nm obtained through experiments.

In FIGS. 6A and 6B, a symbol represents a shift amount obtained through vertical detection with coaxial observation/illumination, and a symbol represents a shift amount obtained through oblique detection with edge scattered light. The shift amount observed by edge scattering light was calculated by similar pattern matching (Japanese Patent Laid-open Publication No. 2-91502, from 14-th line in the lower left column at page 4 to the 3-rd line in the upper left column at page 7).

A method of measuring a shift amount by similar pattern matching will be briefly described. First, a differential image signal emphasizing the contrast of the image signal shown in FIG. 5 is obtained. The differential waveform of the middle rectangular signal (peak) is moved left to superpose it upon the differential waveform of the left rectangular signal (peak), and the shift amount with a maximum correlation value is set to the distance y3. Similarly, the differential waveform of the middle rectangular signal (peak) is moved right to superpose it upon the differential waveform of the right rectangular signal (peak), and the shift amount with a maximum correlation value is set to the distance y4. From the obtained distances y3 and y4, the shift amount y3−y4 is calculated.

In order to more precisely measure the distances y3 and y4 and increase the correlation value, it is preferable to make each rectangular signal (peak) waveform analogous.

As shown in FIG. 6A, in the case of the wafer marks of resist patterns, the shift amounts y3−y4 obtained by detecting edge scattering light are generally equal to those obtained through vertical detection, for the wafer marks of all the serial numbers 0 to 9.

As shown in FIG. 6B, in the case of the wafer marks of silicon projections, the shift amounts y3−y4 obtained by detecting edge scattering light are slightly larger than those obtained through vertical detection, for the wafer marks of all the serial numbers 0 to 9. An increment of the shift amount observed was about 13 nm. As will be described later with embodiments to follow, this increment may be expected to be made small by forming a wafer mark with a plurality of edge patterns, or by other measures.

Next, a second embodiment will be described wherein light scattered from wafer and mask marks with alignment precision evaluating vernier patterns is observed.

Figure 7A:
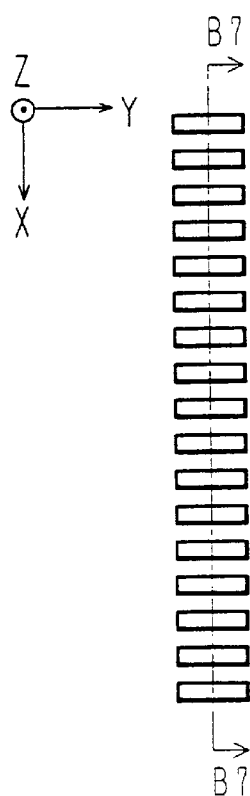
FIG. 7A is a plan view of a wafer mark or mask mark according to a second embodiment.

FIG. 7A is a plan view of a wafer mark and a mask mark to be observed. Rectangular patterns laterally long as viewed in FIG. 7A are disposed in the vertical direction at a pitch of 4 $\mu$m.

Observations were performed for wafers having wafer marks made of resist, polysilicon, or aluminum such as shown in FIG. 7A and mask having mask mark as shown in FIG. 7A. FIGS. 7B to 7E are partial cross sectional views of the wafers and mask taken along one-dot-chain line B7—B7 of FIG. 7A.

Figure 7B:
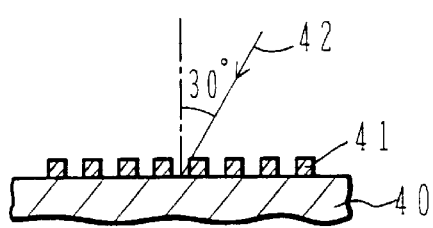
FIGS. 7B to 7D are cross sectional views of wafers with wafer marks.

FIG. 7B shows a wafer with wafer marks made of resist. On the surface of a silicon substrate 40, resist patterns 41 are formed. The height of the resist pattern is 1.8 $\mu$m.

Figure 7C:
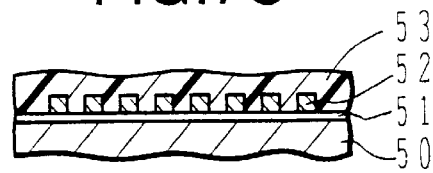

FIG. 7C shows a wafer with wafer marks made of polysilicon. An $SiO_2$ film 51 is formed on the surface of a silicon substrate 50. A wafer mark 52 of polysilicon is formed on the surface of the $SiO_2$ film 51. Covering the surface of the $SiO_2$ film 51 and the wafer mark 52, a resist film 53 is coated. The thickness of the $SiO_2$ film 51 is 102.6 nm, the thickness of the wafer mark is 198.6 nm, and the thickness of the resist film 53 is 1.8 $\mu$m. Assuming that this substrate is formed by MOSFET manufacture processes, the $SiO_2$ film 51 corresponds to the gate insulating film, and the polysilicon wafer mark 52 corresponds to the gate electrode.

Figure 7D:
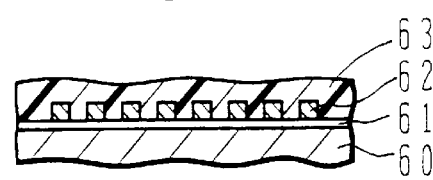

FIG. 7D shows a wafer with wafer marks made of aluminum. An $SiO_2$ film 61 is formed on the surface of a silicon substrate 60. A wafer mark 62 of aluminum is formed on the surface of the $SiO_2$ film 61. Covering the surface of the $SiO_2$ film 61 and the wafer mark 62, a resist film 63 is coated. The thickness of the wafer mark is 523 nm, and the thickness of the resist film 63 is 1.8 $\mu$m. On the surface of the wafer mark 62, a thin silicon film is formed as an antireflection film.

Figure 7E:
FIG. 7E is a cross sectional view of a mask with a mask mark.

FIG. 7E shows a mask with a mask mark. A mask mark 71 is formed on the bottom surface of an X-ray transmission film (membrane) 70 made of SiN, the mask mark being made of tantalum functioning as an X-ray absorption member. The thickness of the X-ray transmission film 70 is 2 $\mu$m, and the height of the mask mark 71 is 0.75 $\mu$m.

Edge scattering light from the samples shown in FIGS. 7B to 7E was observed along the direction (direction indicated by an arrow 42 in FIG. 7B) slanted downward by 30 degrees from the normal direction of the wafer surface (drawing surface) of FIG. 7A. Scattered light from the wafer marks of FIGS. 7B to 7D was detected through the membrane of the X-ray mask. A metal microscope used for the observation has an object lens with a numerical aperture NA of 0.4 and a detection magnification of 100. Illumination light is white light radiated from a halogen lamp, and illumination is coaxial observation/illumination with telecentric illumination.

Figure 7F:
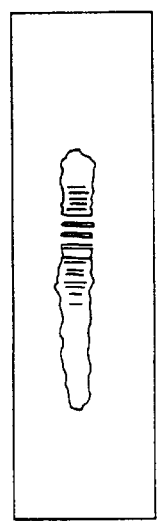
FIG. 7F is a diagram sketched from a metal microscopy photograph of edge scattering light from the wafer mark shown in FIG. 7A.

FIG. 7F is a diagram sketched from a photograph of focussed light scattered from the edges of wafer (FIG. 7C) with wafer marks made of polysilicon. At the area about one third from the top of the image shown in FIG. 7F, two images of edge scattering light in the plane of the object surface are focussed clearly. Images of light scattered from the upper and lower edges are unsharp because the edge is spaced apart from the object surface. As above, the light scattered from the edge in the plane of the object surface can be focussed clearly, being equivalent to the vertical detection, and image distortions as with the oblique detection are not generated. Since white light is used as the illumination light, light interference between the mask and wafer was not observed. Clear images were detected from the masks or wafers shown in FIGS. 7B, 7D, and 7E, similar to the wafers shown in FIG. 7C.

Figure 7G:
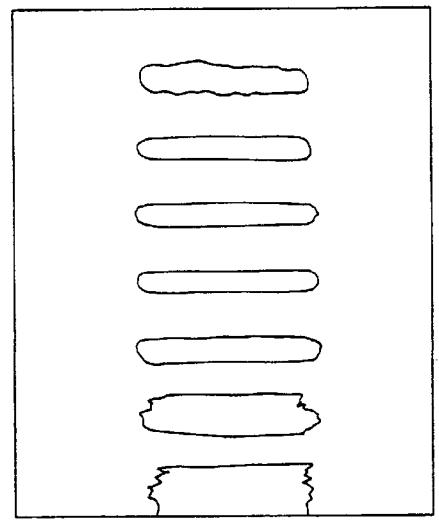
FIG. 7G is a diagram sketched from an image of edge scattering light from the wafer mark shown in FIG. 7A, the image having been taken by a television camera.
Figure 8A:
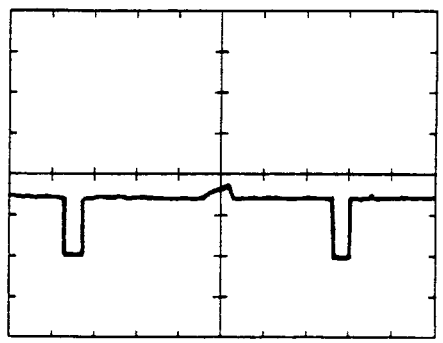
FIGS. 8A to 8F are diagrams showing signal waveforms at each scan line of the image taken by the television camera as shown in FIG. 7G.
Figure 8D:
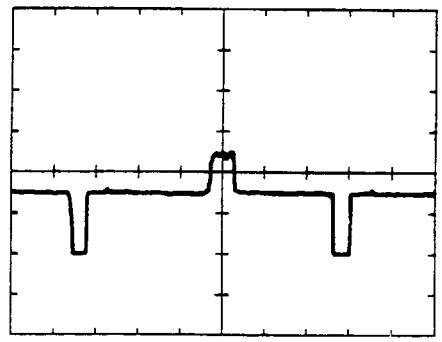
Figure 8B:
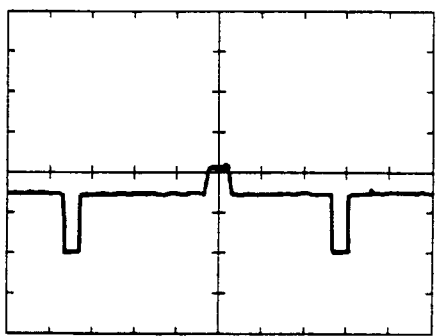
Figure 8E:
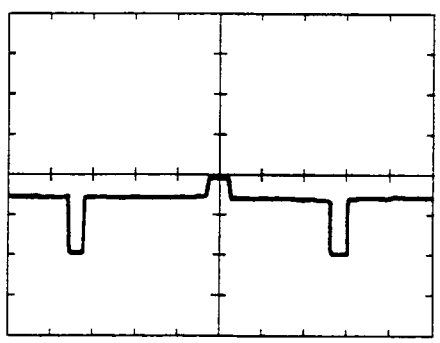
Figure 8C:
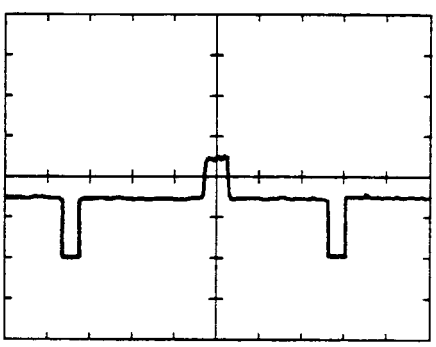
Figure 8F:
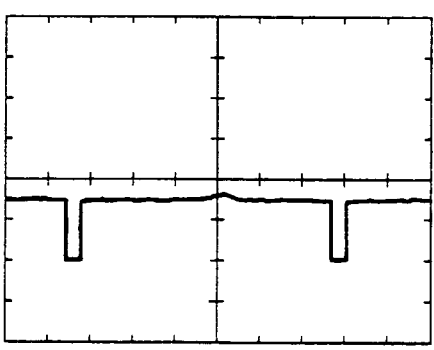

FIG. 7G shows images taken by a television camera with an optical magnification of 100 and an electrical magnification of 9.3. The horizontal scan direction is in the lateral direction (Y direction) of FIG. 7A. The pitch between scan lines is 15 $\mu$m as converted to the distance on the object surface. That is, the pitch between scan lines only in the even field is 30 nm. As shown in FIG. 7G, three images at the central area are clearly focussed, and the upper and lower images are unsharp. Clear images were detected also for other samples, similar to the wafers shown in FIG. 7C.

FIGS. 8A to 8F show signal waveforms corresponding to scan lines taking a clear upper third image. FIGS. 8A to 8F are signal waveforms corresponding to the 120-th to 125-th scan lines in the even field. The abscissa represents the lateral direction (Y direction) of FIG. 7A and the ordinate represents a light intensity.

As shown in FIGS. 8B to 8E, rectangular signals (peaks) appear at the central area at the four scan lines of 121-th to 124-th. This signals (peaks) corresponds to the image formed by edge scattering light. Minus rectangular signals (peaks) on both sides of the central rectangular signal (peak) correspond to horizontal sync signals of the video signal.

The signal waveforms like that of the third image were obtained also for the upper fourth and fifth images shown in FIG. 7G. Rectangular signals (peaks) at the five scan lines were detected for the fourth image and rectangular peaks at the four scan lines were detected for the fifth image. For the three clear images shown in FIG. 7G, therefore, clear rectangular signals were detected by the total of thirteen scan lines.

If scan lines in the odd field are considered, clear rectangular waveforms are detected by the total of twenty six scan lines. The pitch of scan lines is 15 $\mu$m, and the optical magnification is 100. Therefore, detecting the rectangular signal (peak) waveform at each scan line means detecting a mark being disposed in the range of 26 [lines] ×15 [$\mu$m/line]/100=3.9[$\mu$m] on the object surface along the X direction in FIG. 7A. This range size is generally the same as the detectable range by a conventional chromatic bifocal method. In order to enlarge the detectable range, the pitch along the X direction between rectangular patterns shown in FIG. 7A is made narrower.

If a signal waveform with a clear rectangular signal (peak) is obtained, the position can be detected through similar pattern matching.

With the above method, a position is detected by using light scattered from only one set of edges of the wafer and mask marks. If the edge shape of each mark changes because of variations of a mask forming process or a wafer manufacturing process, the position detection precision lowers. Next, a third embodiment will be described in which the number of edge patterns is increased to prevent the position detection precision from being lowered.

Figure 9A:
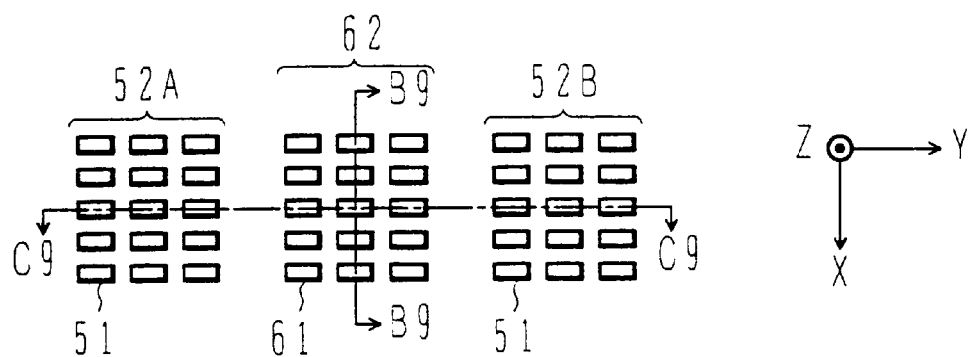
FIG. 9A is a plan view of alignment marks according to a third embodiment.

FIG. 9A is a plan view of alignment marks of the third embodiment of the invention. Consider the coordinate system having the wafer surface as an X-Y plane and its normal direction as a Z-axis. A pair of wafer marks 52A and 52B is disposed along the Y-axis direction, and a mask mark 62 is interposed between the wafer marks 52A and 52B. Other embodiments to follow will be described with the same coordinate system.

Each of the wafer marks 52A and 52B has the structure that mask patterns like that shown in FIG. 7A are disposed in three columns in the Y-axis direction. Namely, rectangular patterns (edge patterns) 51 having edges for scattering incident light are disposed in a matrix shape along the X- and Y-axes. In FIG. 9A, three edge patterns 51 are disposed along the Y-axis and five edge patterns 51 are disposed along the X-axis. Similarly, the mask mark 62 is constituted by edge patterns 61 disposed in a matrix shape.

Figure 9B:
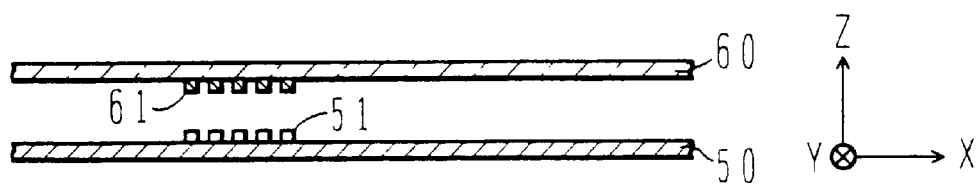
FIG. 9B is a cross sectional view taken along one-dot-chain line B6—B6 in FIG. 9A.

FIG. 9B is a cross sectional view taken along one-dot-chain line B9—B9 in FIG. 9A. Edge patterns 51 are formed on the surface of a wafer 50. Edge patterns 61 are formed on the bottom surface of a mask 60.

Figure 9C:
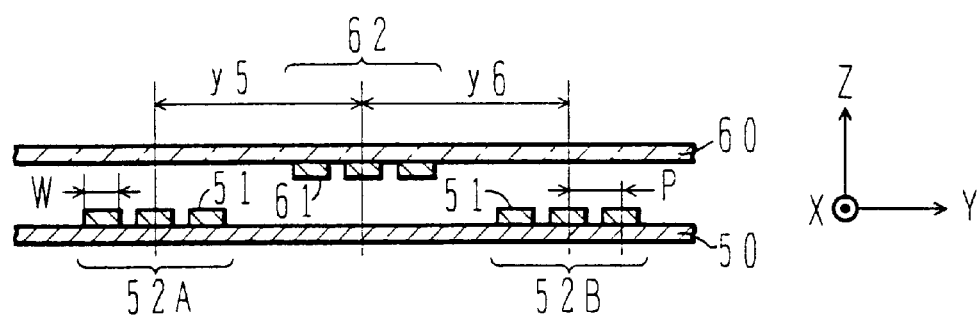
FIG. 9C is a cross sectional view taken along one-dot-chain line C6—C6 in FIG. 9A.

FIG. 9C is a cross sectional view taken along one-dot-chain line C9—C9 in FIG. 9A. In each alignment mark, edge patterns 51 or 61 having a length W in the Y-axis direction are disposed along the Y-axis at a pitch P. The distance between the centers of the wafer mark 52A and mask mark 62 is represented by y5, and the distance between the centers of the wafer mark 52B and mask mark 62 is represented by y6.

FIG. 9D1 shows an image signal which is obtained through observation of edge scattering light from the wafer marks 52A and 52B shown in FIGS. 9A to 9C along the oblique optical axis containing the X-Z plane. FIG. 9D2 shows an image signal which is obtained through observation of edge scattering light from the mask mark 62 with the same optical system. FIG. 9D3 shows a composite image signal composed of two image signals shown in FIG. 9D1 and 9D2. The abscissa represents a position along the Y-axis direction, and the ordinate represents a signal intensity. In each alignment mark, three edge patterns disposed in the Y-axis direction are on the flat plane perpendicular to the oblique optical axis. Therefore, the three edge patterns disposed in the Y-axis direction can be aligned on the object surface of the observation optical system, and edge scattering light from each edge pattern can form a clear image. Three rectangular signals (peaks) appear at each of the positions corresponding to the wafer marks 52A and 52B and mask mark 62. The width of the rectangular signal (peak) is equal to the length W of the edge pattern in the Y-axis direction, and the pitch between rectangular signals (peaks) is equal to the pitch P between edge patterns disposed in the Y-axis direction.

FIG. 9E shows correlation values between the differential waveforms of the wafer mark 52A and mask mark 62 obtained from a differential image signal of the image signal shown in FIG. 9D3. The abscissa represents a shift amount $\Delta$y in the y-axis direction and the ordinate represents a correlation value. In FIG. 9D3, the differential waveform of the wafer mark 52A is moved parallel in the positive y-axis direction. When the right rectangular signal (peak) of the wafer mark 52A is superposed on the left rectangular signal (peak) of the mask mark 62, the correlation value becomes large, and a peak a1 shown in FIG. 9E appears.

As the differential waveform is further moved in the positive y-axis direction by the pitch P, the right and middle two rectangular signals (peaks) of the wafer mark 52A ere superposed respectively on the middle and left two rectangular signals (peaks) of the mask mark 62. Since the two pairs of rectangular signals (peaks) are superposed, the correlation value becomes larger than when one pair of rectangular signals (peaks) is superposed, and a rectangular signal (peak) a2 higher than the rectangular signal (peak) a1 appears.

As the differential waveform is further moved in the positive y-axis direction by the pitch P, the three rectangular signals (peaks) of the wafer mark 52A are superposed respectively on the three rectangular signals (peaks) of the mask mark 62. The correlation value becomes maximum and the highest peak a3 appears. As the waveform is further moved, peaks having generally the same heights as the peaks a2 and a1 appear sequentially. The shift amount $\Delta$y giving the highest peak a3 corresponds to the inter-center distance y5 between the wafer and mask marks 52A and 62. The inter-center distance y6 between the wafer and mask marks 52B and 62 can be obtained in the similar manner.

As above, three edge patterns disposed in the Y-axis direction allow to detect edge scattering light from the three edge patterns at the same time. Therefore, even if the shape of one edge pattern is deformed from an ideal shape because of variations of manufacture processes or the like, the observations of edge scattering light from the other edge patterns not deformed allows a high precision position detection. The number of edge patterns disposed in the Y-axis direction is not limited to three, but two or more edge patterns are expected to provide similar effects as above.

With the use of alignment marks shown in FIGS. 9A and 9C, slightly lower peaks a2 appear on both sides of the maximum peak a3 as shown in FIG. 9E. If the peak a2 is erroneously judged to be the maximum peak, then a correct position detection is impossible. This misjudgment becomes likely to occur when the number of edge patterns disposed in the Y-axis direction is increased or when the S/N ratio of the image signal lowers.

Figure 10A:
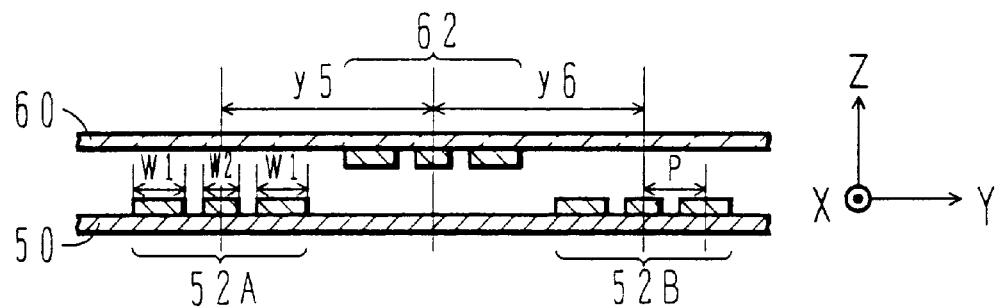
FIG. 10A is a cross sectional view of alignment marks according to a fourth embodiment.

A fourth embodiment will be described in which alignment marks which suppress peak misjudgment are used. FIG. 10A is a cross sectional view of alignment marks of the fourth embodiment. The plan layout of the alignment marks is the same as the third embodiment shown in FIG. 9A. Each of the alignment marks 52A, 52B and 62 has three edge patterns disposed in the Y-axis direction. In each alignment mark, the edge lengths of the edge patterns along the Y-axis direction are not uniform. Each edge pattern is formed so that when one alignment mark is moved parallel in the Y-axis direction and superposed on another alignment mark, the lengths of corresponding edges of the edge patterns become coincide with each other.

The edge length of the middle edge pattern of each alignment mark shown in FIG. 10A is W2, and the edge lengths of edge patterns on both side of the middle edge pattern are W1. In the example shown in FIG. 10A, W1>W2. In each alignment mark, the pitch of edge patterns in the Y-axis direction is P. The inter-center distance between the wafer and mask marks 52A and 62 is y5, and the inter-center distance between the wafer and mask marks 52B and 62 is y6.

Figure 10B:
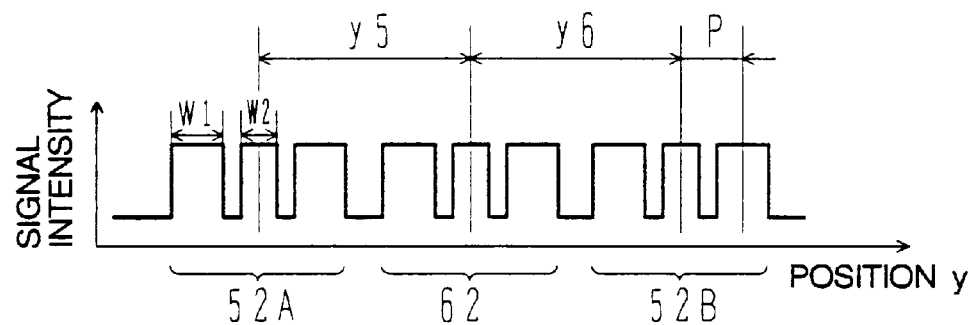
FIG. 10B is a diagram showing an image signal of an image of edge scattering light.

FIG. 10B shows an image signal obtained through observations of the alignment marks shown in FIG. 10A along the oblique axis in the X-Z plane. Three rectangular signals (peaks) are detected at positions corresponding to respective wafer marks 52A and 52B and the mask mark 62. In each alignment mark, the width of the middle rectangular signal (peak) is W2 and the widths of the rectangular signals (peaks) on both sides of the middle rectangular signal (peak) are W1. In each alignment mark, the pitch between rectangular signals (peaks) is the same as the pitch P between edge patterns in the Y-axis direction.

Figure 10C:
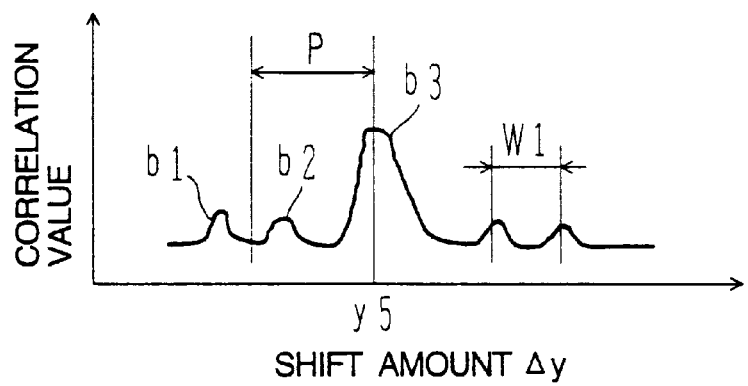
FIG. 10C is a graph showing a correlation function of the image signal shown in FIG. 10B.

FIG. 10C shows a correlation value between differential waveforms of the wafer and mask marks 52A and 62 of a differential image signal of the image signal shown in FIG. 10B. Similar to FIG. 9E, five rectangular signals (peaks) appear. A rectangular signal (peak) b1 corresponds to when the right rectangular signal (peak) of the wafer mark 52A is superposed on the left rectangular signal (peak) of the mask mark 62. A rectangular signal (peak) b2 corresponds to when the right and middle rectangular signals (peaks) of the wafer mark 52A are superposed on the middle and left rectangular signals (peaks) of the mask mark 62. A rectangular signal (peak) b3 corresponds to when the three rectangular signals (peaks) of the wafer mark 52A are superposed on the three rectangular signals (peaks) of the mask mark 62.

In the state where the rectangular signal (peak) b2 appears, the correlation value is smaller than the case of the same widths of all rectangular signals (peaks) because the widths of superposed rectangular signals (peaks) are different (W1>W2). As a result, the height of the rectangular signal (peak) b2 is lower than the height of the rectangular signal (peak) a2 shown in FIG. 9E. Since the ratio of the height of the highest rectangular signal (peak) b3 to the heights of the rectangular signals (peaks) b2 on both sides of the highest rectangular signal (peak) becomes large, the highest rectangular signal (peak) becomes hard to be erroneously judged.

In the example shown in FIG. 10A, the edge lengths of the edge patterns of each alignment mark are made irregular.

Instead, the edge lengths may be made uniform and the pitches between edge patterns may be made irregular. Alternatively, both the edge lengths and pitches may be made irregular. In order to suppress the generation of misalignment, the irregular degree of the edge lengths or pitches is preferably set to +/− 10% or higher.

In FIGS. 9E and 10C, the image signal of one of the wafer mark and mask mark is moved parallel to superpose the image signal to the other image signal and detect the relative position. Other methods may be used for detecting the relative position. For example, the image signals of the wafer mark and mask mark may be folded or turned back at a plurality of points near the centers of the image signals. The fold point having a highest correlation coefficient is used as the center of the mark. In this manner, the center positions of the wafer and mask marks can be obtained and the position of each mark can be detected. In this case, each mark is formed so that both the sides of the center become symmetrical.

Next, a fifth embodiment will be described with reference to FIGS. 11A to 11E, 12, 13A to 13C, and 14A and 14B.

Figure 11A:
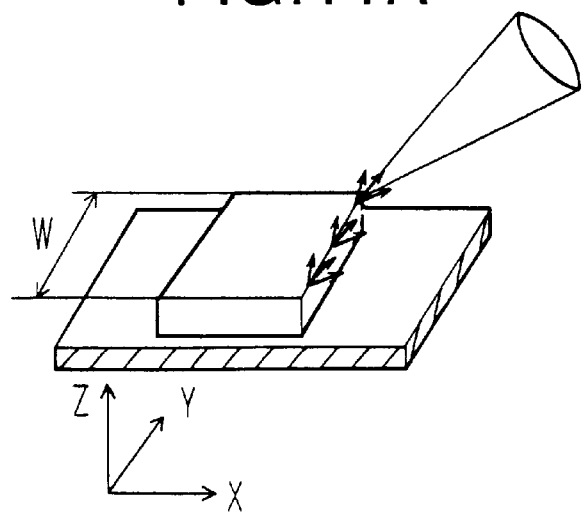
FIGS. 11A, 11C, and 11E are perspective views of one edge pattern constituting a wafer mark.
Figure 11B:
FIGS. 11B and 11D are diagrams showing images by edge scattering light from the edges shown in FIGS. 11A and 11C.

FIG. 11A is a perspective view of one edge pattern of a wafer mark. Illumination light is obliquely applied along the oblique optical axis in the X-Z plane, and light scattered from the edge extending in the Y-axis direction is observed. In this case, the image formed by scattered light has an intensity distribution given by the equation (4). Therefore, as shown in FIG. 11B, a long line image is obtained in correspondence with the line spread function of the lens.

Figure 11C:
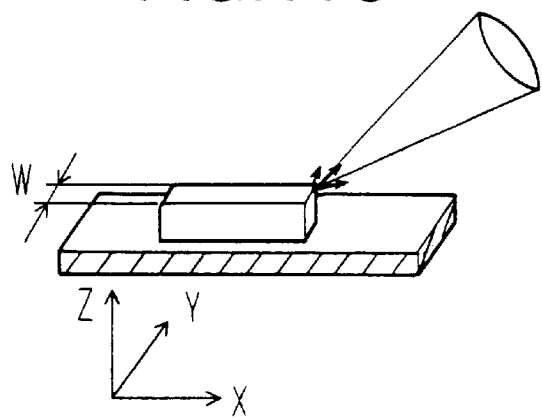

As shown in FIG. 11C, the length of the edge is shortened in the Y-axis direction. As the edge length becomes shorter than the lens resolution, the intensity distribution O(x, y) of reflected light given by the equation (1) may be substituted by δ(x, y). Therefore, the equation (1) can be transformed into:

$$I(x, y) = \int\int \delta(x-x', y-y')PSF(x', y')dx'dy' \qquad (6)$$

$$= \int PSF(x, y)$$

where PSF(x, y) represents a point spread function of the lens.

If illumination light has continuous spectra, it can be expressed by:

$$I(x, y)=\int PSF\lambda(x-\Delta x\lambda, y-\Delta y\lambda)d\lambda \qquad (7)$$

where λ represents a wavelength of light, PSFλ represents a point spread function at the wavelength λ, Δxλ represents a lateral shift amount of a point image in the X-axis direction caused by the lens chromatic aberration at the wavelength λ, Δyλ represents a lateral shift amount of a point image in the Y-axis direction caused by the lens chromatic aberration at the wavelength λ, and the integration is performed for the whole wavelength range.

Figure 11D:

As above, as the edge length is made equal to or shorter than the lens resolution, a point image such as shown in FIG. 11D can be obtained which is analogous to the point spread function of the lens.

Figure 11E:
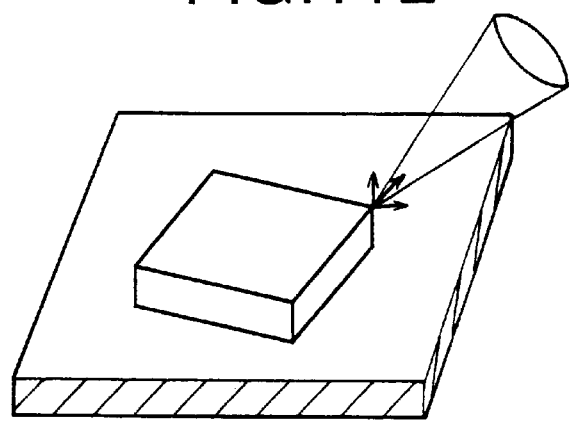

FIG. 11E is a perspective view of an edge pattern wherein illumination light is scattered near from the apex at which three planes cross. In this specification, a pattern having an edge which scatters illumination light and a pattern having an apex which scatters illumination light are collectively called an edge pattern.

The image formed by light scattered near from the apex shown in FIG. 11E can be also considered to be analogous to the point spread function given by the equations (6) and (7). On an $SiO_2$ film on a silicon wafer, an aluminum wafer mark is formed which has a square plan shape with a side length of 40 μm and is 523 nm thick. A resist film is coated over the wafer mark to a thickness of 1.8 μm. Scattered light from the apex of the wafer mark was observed and a point image such as shown in FIG. 11D was able to observe. The angle between the wafer normal direction and the illumination and observation optical axes was set to 30 degrees.

Figure 12:
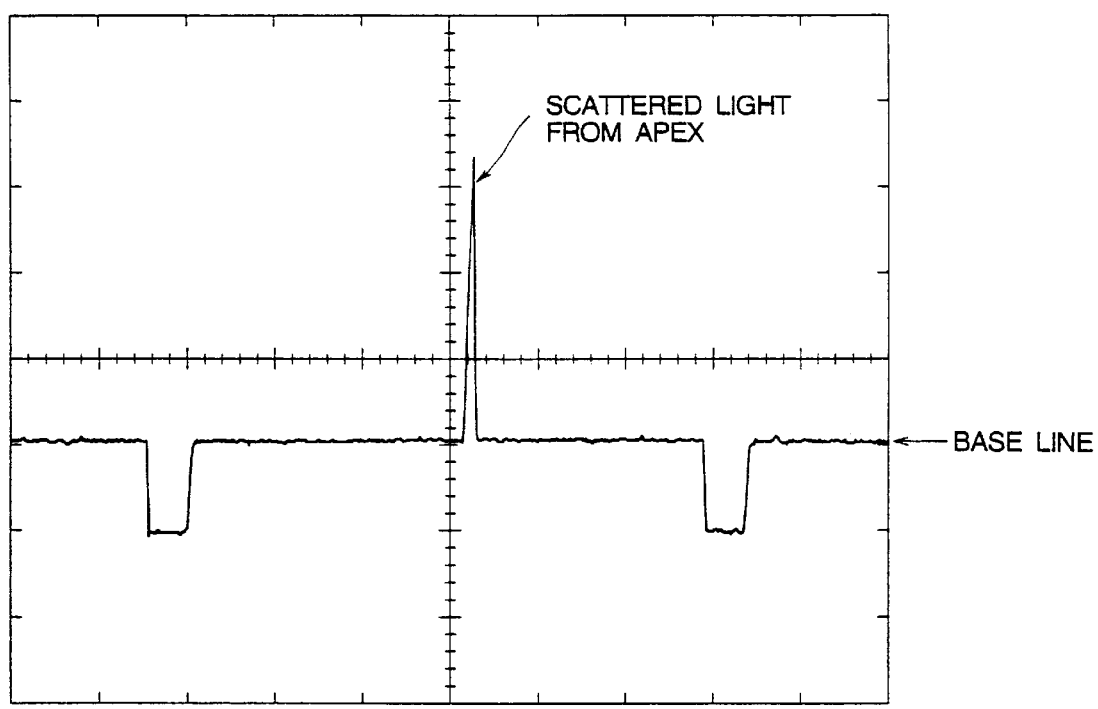
FIG. 12 is a graph showing a signal of a point image formed by scattering light from an apex.

FIG. 12 shows an image signal of a point image formed by scattered light from the apex. A spike-shaped peak at the center corresponds to the point image formed by scattered light. As shown in FIG. 12, a sharp peak having very small waveform distortion was obtained.

Figure 13A:
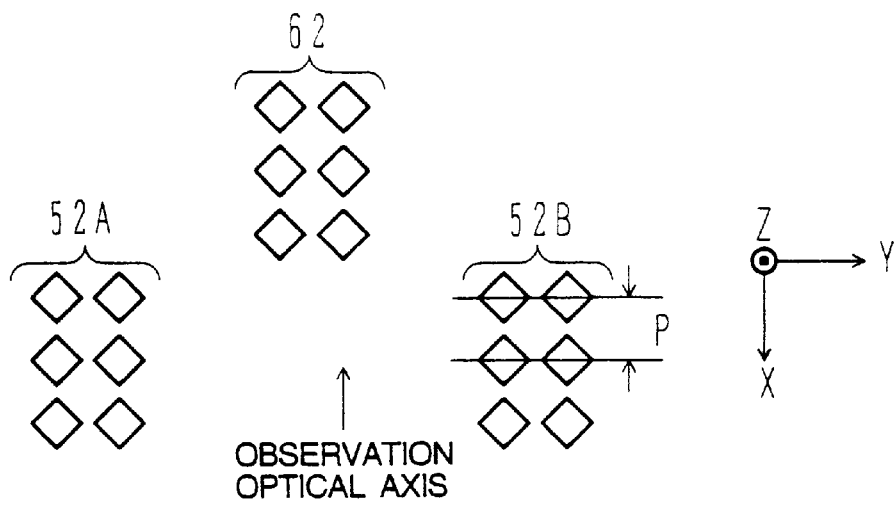
FIGS. 13A to 13C are plan views of wafer and mask marks having an apex from which illumination light is scattered.
Figure 13B:
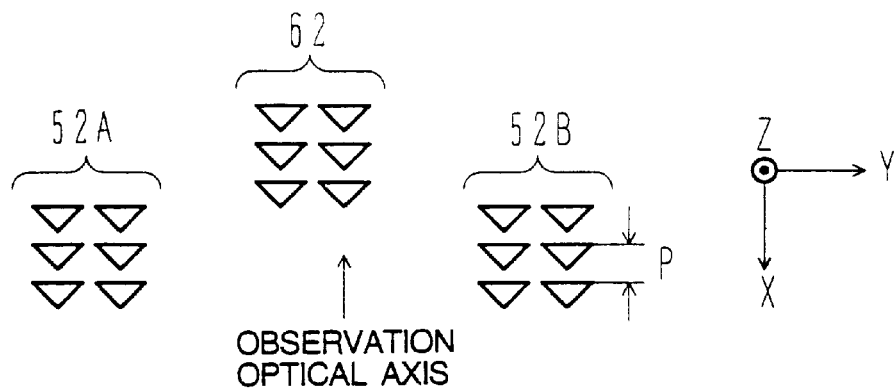
Figure 13C:
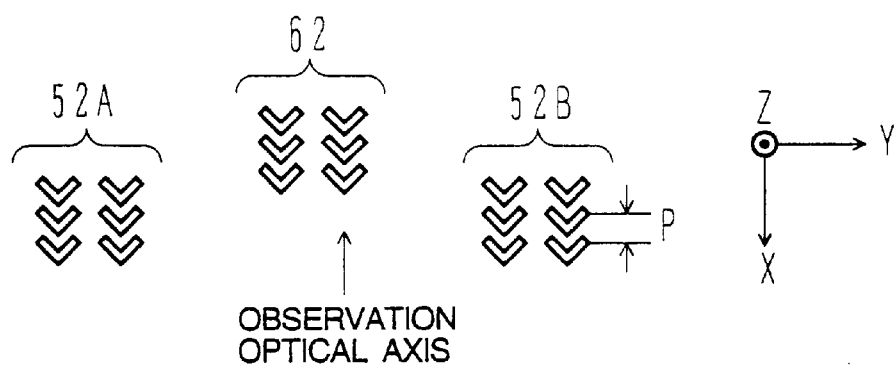

FIGS. 13A to 13C are plan views of mask marks and wafer marks having an apex which scatters illumination light. A mask mark 62 is disposed between wafer marks 52A and 52B.

The alignment marks 52A, 52B, and 62 shown in FIG. 13A each are constituted by edge patterns having a square plan shape disposed in three rows at a pitch P in the X-axis direction, and in two columns in the Y-axis direction. One apex of each edge pattern of a square plan shape is directed in the positive X-axis direction, i.e., toward the observation optical axis direction.

An edge pattern shown in FIG. 13B has an isosceles right triangle plan shape, and its apex is directed in the positive X-axis direction. An edge pattern shown in FIG. 13C has a chevron plan shape, and its apex is directed in the positive X-axis direction. The layouts of edge patterns constituting the alignment marks shown in FIGS. 13B and 13C are similar to the alignment marks shown in FIG. 13A.

Position alignment between a wafer and a mask can be made by a method similar to the method described with FIGS. 9A to 9E, through observation of scattered light from the apexes of the edge patterns disposed as shown in FIGS. 13A to 13C. In the method described with FIGS. 9A to 9E, the image signal is differentiated to obtain a correlation value. However, in this embodiment, the image signal formed by scattered light from the apex has already a sharp peak so that the image signal itself may be used for obtaining a correlation value, without differentiation.

The triangle plan shape such as shown in FIG. 13B can narrow the pitch P in the X-axis direction, as compared to the square plan shape. The chevron plan shape such as shown in FIG. 13C can narrow the pitch still further.

The factors of generating position detection errors contained in a line image and a point image analogous to the line spread function and the point spread function are anticipated to be different. If an error factor has a nature that error components are accumulated when an image formed by scattered light is integrated in the longitudinal direction (i.e. Y direction in FIG. 11A), this error factor may considerably affect the line image although it may not affect the point image. Conversely, if an error factor has a nature that error components are cancelled out when an image formed by scattered light is integrated in the longitudinal direction, this error factor may considerably affect the point image although it may not affect the line image. It is therefore considered that the position detection error can be reduced when a line image is used or when a point image is used.

It can be expected that the total position detection error can be reduced if both an edge which forms a line image and an edge or apex which forms a point image are used in an alignment mark.

Figure 14A:
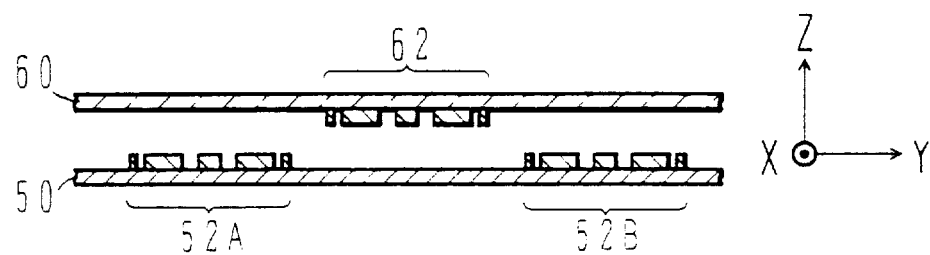
FIG. 14A is a cross sectional view of alignment marks according to a fifth embodiment.

FIG. 14A is a cross sectional view of alignment marks according to the fifth embodiment. Wafer marks 52A and 52B are formed on the surface of a wafer 50, and a mask mark 62 is formed on the bottom surface of a mask 60. Each alignment mark is constituted by five edge patterns disposed along the Y-axis direction. Of the five edge patterns, the edge patterns at opposite ends have their edge lengths in the Y-axis direction shorter than the lens resolution such as shown in FIG. 11C, or have apexes for scattering illumination light such as shown in FIG. 11E.

Figure 14B:
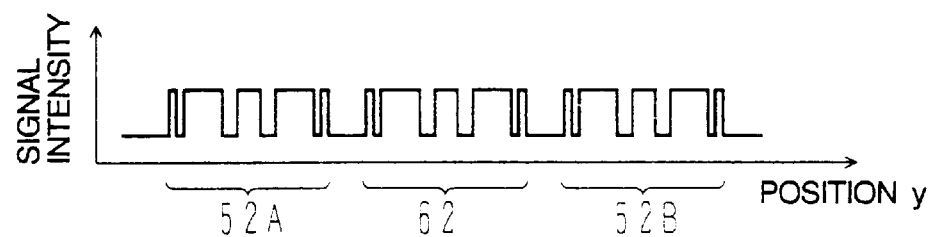
FIG. 14B is a diagram showing a signal of an image formed by edge scattering light.

FIG. 14B shows an image signal obtained through observation of edge scattering light from the alignment marks shown in FIG. 14A along the oblique optical axis direction in the X-Z plane. Five peaks appear at each of the positions corresponding to the wafer marks 52A and 52B and the mask mark 62. Of the five peaks, the peaks at opposite ends are narrow and can be considered analogous to the point spread function of the lens. This image signal is differentiated, and the differential image signal is used for similar pattern matching to detect the relative position. The position detection can be performed therefore by using both the point and line images.

In the first to fifth embodiments, the method of reducing a position detection error has been described by disposing edge patterns along the normal direction of the incidence plane. Next, a method of detecting a position without being influenced by a proximity gap between a wafer and a mask will be described in which edge patterns are disposed in parallel to the incidence plane.

Figure 15A:
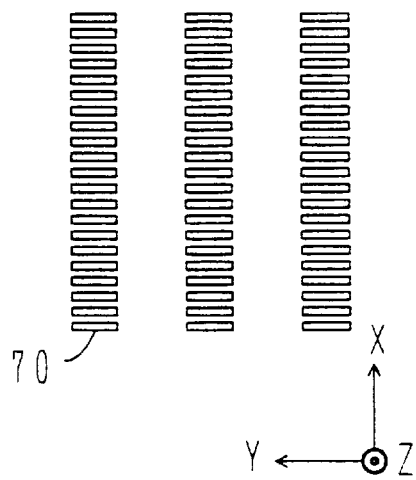
FIG. 15A is a plan view of a wafer mark according to a sixth embodiment.

FIG. 15A is a plan view of a wafer mark according to the sixth embodiment. Twenty one rectangular edge patterns 70 are disposed in the X-axis direction at a pitch of 4 μm. This edge pattern column is disposed in three columns in the Y-axis direction.

Figure 15B:
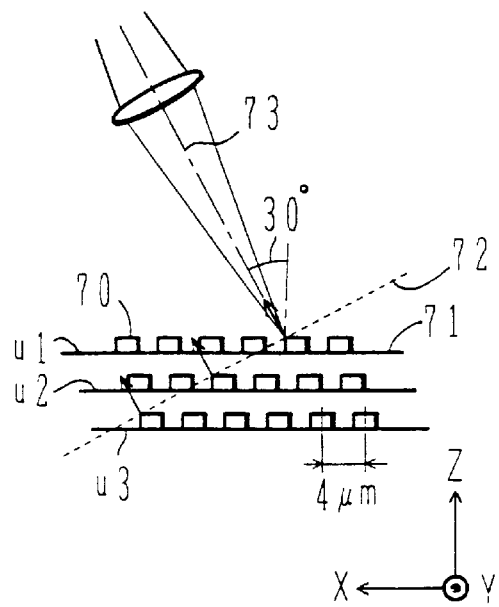
FIG. 15B is a schematic cross sectional view of the wafer mark shown in FIG. 15A and an observation optical system in which the wafer marks are observed obliquely.

FIG. 15B is a schematic cross sectional view of a wafer mark and an optical system in which the wafer mark is observed along the optical axis direction with an incidence angle of 30 degrees in the X-Z plane. Edge patterns 70 are formed on the surface of the wafer 71. Illumination light is applied coaxially with the oblique optical axis 73 and scattered light from the edges of the edge patterns 70 are observed. A broken line 72 indicates the object surface of the object lens of the observation optical system.

When the wafer 71 is at the position u1, the fifth edge pattern from the left in FIG. 15B is positioned at the object surface 72. Next, as the wafer 71 is moved parallel along the optical axis 73 to positions u2 and u3, the third edge pattern from the left and the leftmost edge pattern are positioned at the object surface 72.

If the pitch of edge patterns 70 in the X-axis direction is 4 μm, the edge patterns come the object surface one after another as the wafer 71 is moved along the optical axis by 2 μm at a time. Therefore, if the depth of focus of the lens is 1 μm, one of edge patterns is always on the object surface and a clear image can be obtained.

Figure 15C:
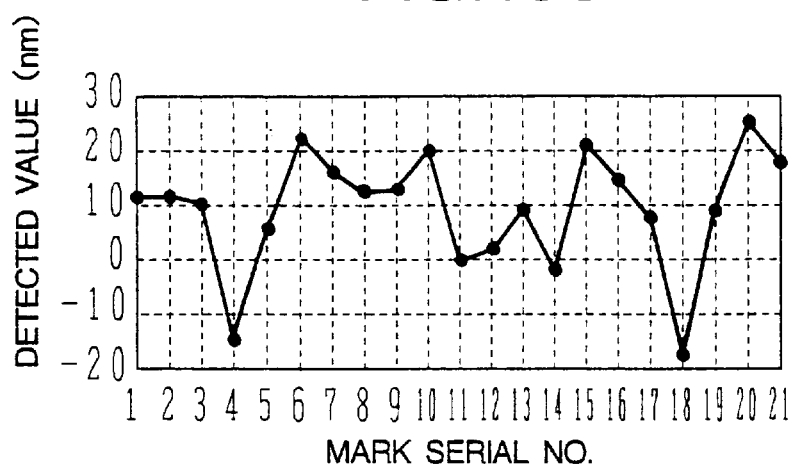
FIG. 15C is a graph illustrating a detected position dependency upon wafer positions in which the wafer mark shown in FIG. 15A are observed by the method illustrated in FIG. 15B to detect the positions of respective edges.

FIG. 15C illustrates a dependency of a detecting precision upon a wafer position, the edge pattern position being detected through observation of wafer marks shown in FIG. 15A by the method described with FIG. 15B. The abscissa represents a serial number of an edge pattern in focus, and the ordinate represents a detected value in the unit of nm. The detected value defined is a half of a difference between spaces between an edge pattern at the middle in the Y-axis direction and one and the other of edge patterns on both sides of the first mentioned edge pattern.

The motion distance of the wafer along the optical axis from the observation state of the first edge pattern to the observation state of the twenty first edge pattern, is 40 μm. As shown in FIG. 15C, even if the wafer is moved by 40 μm, the detected value is within the range from −17 nm to +25 nm.

Even if the wafer is moved along the optical axis direction, the position of an edge pattern can be detected relatively precisely. When the wafer is also moved along the normal direction to the surface of the wafer, it can be detected relatively precisely. The main factor of variation in detected values may be variation of the shapes of edge patterns. Therefore, as described in the third embodiment, a more precise position detection may be expected if a plurality set of edge patterns are disposed in the Y-axis direction and a plurality of edge patterns are observed at the same time.

The features of this method envisaged from the above experiment results will be described with reference to FIG. 16.

Figure 16:
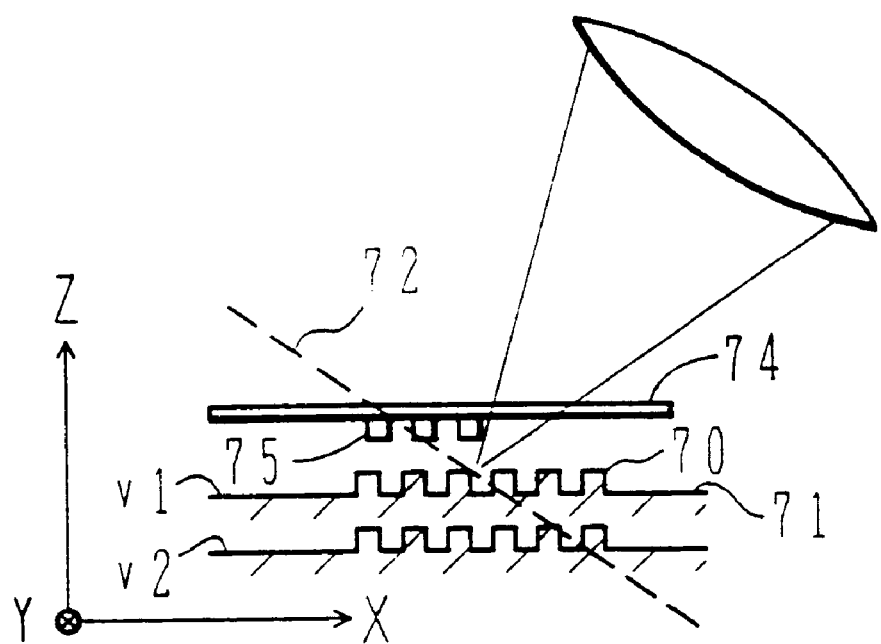
FIG. 16 is a cross sectional view of wafer marks and a mask mark according a sixth embodiment.

FIG. 16 is a cross sectional view of wafer and mask marks with a plurality of edge patterns disposed in parallel to the incidence plane. A broken line 72 indicates the object surface of an object lens of the observation optical system.

When a wafer 71 is at a position v1 or v2 shown in FIG. 16, one of the edge patterns is on the object surface 72. Therefore, even if the wafer 71 is at any one of the positions v1 and v2, an edge image by scattered light from the wafer and mask marks can be detected clearly. Since the mask mark has a plurality of edge patterns disposed in the X-axis direction, the edge image by scattered light from the mask mark can be detected clearly even if the Z-axis position of the mask is shifted. If the pitch between edge patterns is selected so that one of edge patterns enters the range of the depth of focus of the lens, the edge image can be detected clearly even if the edge is not just on the object surface.

Stable position detection can be performed therefore even if the positions of the wafer and mask in the Z-axis direction shift within a certain range. The gap between the wafer and mask can be obtained by a method similar to that described with FIGS. 2C and 2D.

In FIGS. 15 and 16, observation of scattered light from a straight line edge has been described. Also for the observation of scattered light from an apex, stable position detection is ensured by disposing a plurality of edge patterns in the X-axis direction at a predetermined pitch, even if the wafer and mask displace in the Z-axis direction. The gap between the wafer and mask can also be obtained.

In the first to sixth embodiments, position alignment in the edge longitudinal direction can be performed through oblique observation of wafer and mask marks. Since the optical system is not required to be placed in the exposure area, the position detection is possible even during exposure after the position alignment. Since the illumination and observation optical axes are coaxial, there is no axis misalignment so that an image always stable can be obtained.

Since telecentric illumination is used, a change in an image by edge scattering light can be suppressed if the edge displaces in the range of the depth of focus.

Regular reflection light of illumination light does not enter the observation optical system, but only scattered light enters. Therefore, by adjusting the intensity of illumination light, an S/N ratio of an image formed by scattered light can be adjusted. Since regular reflection light does not enter, an underlying layer on a wafer does not adversely affect position detection. Edge scattering light utilizes a scattering phenomenon on uneven surfaces. Therefore, influence by light interference phenomenon and the like in a resist film can be eliminated so that stable position detection is possible. Since incoherent illumination light can be used, there is no light interference at the gap between a wafer surface and a mask surface. Edge scattering light can be observed even if coherent light is used.

In the above embodiments, the angle between the observation optical axis and the normal to the exposure surface is set to 30 degrees. A clear image by scattered light was obtained at the angle in the range from 15 to 45 degrees.

In the above embodiments, the illumination and observation optical axes are set coaxially. The positional relationship between the illumination and observation optical axes are not necessarily required to be coaxial, if as described earlier the regular reflection light of illumination light does not enter the observation optical system. For example, the illumination and observation optical axes may be set so that an angle between two line images of the axes vertically projected on the exposure surface is smaller than 90 degrees.

Figure 17A:
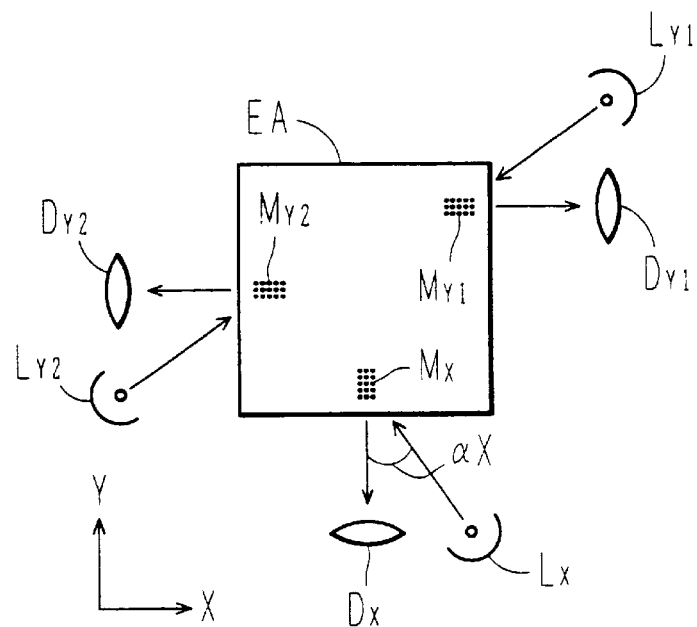
FIGS. 17A to 17C are plan views illustrating the disposal of optical systems relative to an exposure area.

FIG. 17A is a schematic plan view showing the positional relationship between position aligning marks, an illumination optical system, and an observation optical system wherein the illumination and observation optical axes are set so that an angle between two line images of the axes vertically projected on the exposure surface becomes smaller than 90 degrees. Disposed in an exposure area EA are an X-axis position aligning mark $M_X$ and Y-axis position aligning marks $M_{Y1}$ and $M_{Y2}$. In FIG. 17A, the wafer and mask marks are shown as one mark.

With these three marks $M_X$, $M_{Y1}$, and $M_{Y2}$, position alignment in the X- and Y-axis directions and in the rotation direction ($\theta_Z$ direction) in the X-Y plane is possible.

Illumination light is applied from an illumination optical system $L_X$ to the mark $M_X$ and edge scattering light from the mark $M_X$ is observed by an observation optical system $D_X$. Since an angle $\alpha_X$ between two line images of the illumination and observation optical axes vertically projected on the exposure surface is smaller than 90 degrees, both the optical systems $D_X$ and $L_X$ can be set on one side of the exposure area EA.

The illumination optical systems $L_{Y1}$ and $L_{Y2}$ and observation optical systems $D_{Y1}$ and $D_{Y2}$ of the marks $M_{Y1}$ and $M_{Y2}$ can also be set on one side of the exposure area EA.

The images of the illumination optical axis and observation optical axis vertically projected on the exposure surface may superpose one upon the other and only the angles between both the axes and the Z-axis are set different.

Figure 17B:
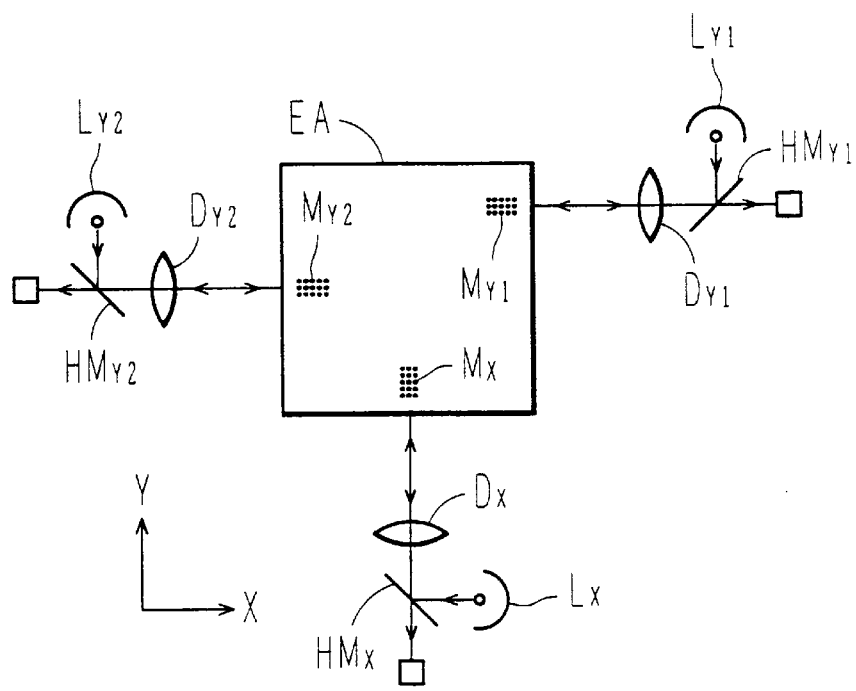

FIG. 17B shows another arrangement in which the optical axes of the illumination optical systems $L_X$, $L_{Y1}$, and $L_{Y2}$ shown in FIG. 17A are set coaxial with the optical axes of the observation optical systems $D_X$, $D_{Y1}$, and $D_{Y2}$ by using half mirrors $HM_X$, $HM_{Y1}$, and $HM_{Y2}$. The coaxial arrangement of the optical axes of the illumination and observation optical systems facilitates the setting of optical systems.

Figure 17C:
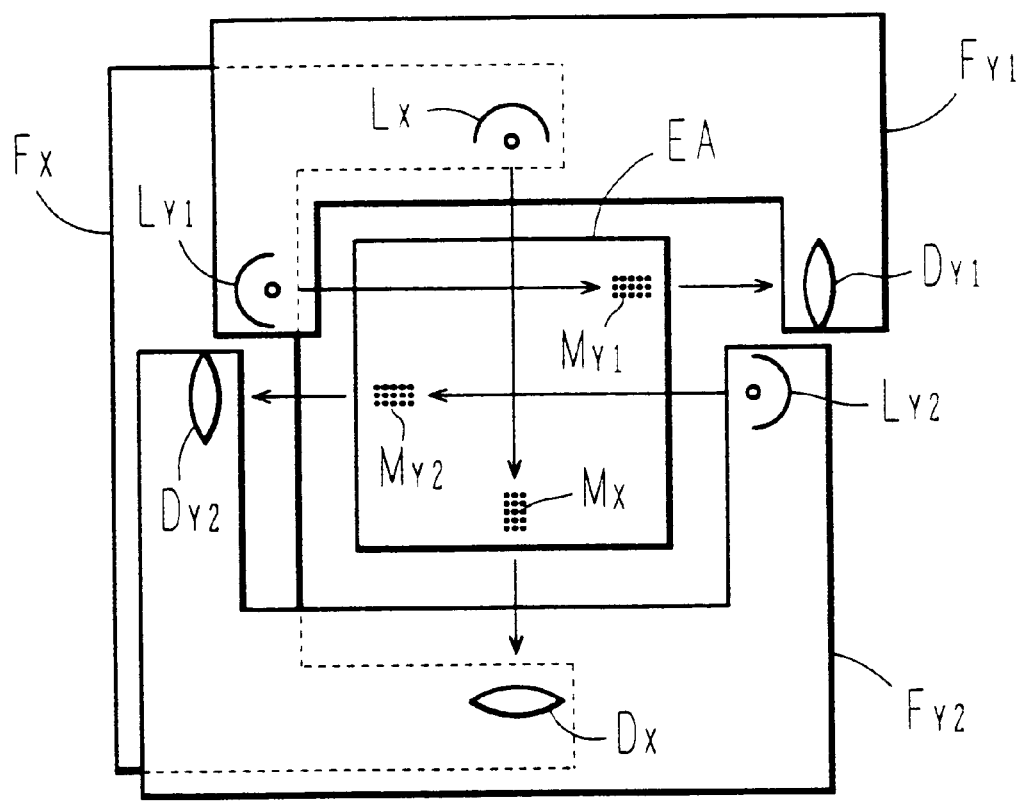

FIG. 17C is a schematic plan view showing the positional relationship between position aligning marks, an illumination optical system, and an observation optical system wherein as in conventional position alignment, illumination light is applied obliquely to the exposure surface, and the image of a mark is observed by using regular reflection light from the mark. Similar to FIG. 17A, disposed in an exposure area EA are an X-axis position aligning mark My and Y-axis position aligning marks $M_{Y1}$ and $M_{Y2}$.

In order to observe light regularly reflected from a mark, the illumination and observation optical axes are required to be generally symmetrical with a normal to the exposure surface. For example, illumination light is applied to a mark $M_X$ downward from an illumination optical system $L_X$, and regular reflection light is observed by a detection optical system at a lower position in FIG. 17C. It is therefore necessary to dispose the illumination optical system and observation optical system so as to face each other through the exposure area. In order to prevent a shift of the relative position between the illumination and observation optical axes, it is preferable to mount the illumination and observation optical systems $L_X$ and $D_X$ on one fixing unit $F_X$.

The illumination optical systems $L_{Y1}$ and $L_{Y2}$ and observation optical systems $D_{Y1}$ and $D_{Y2}$ of the marks $M_{Y1}$ and $M_{Y2}$ are also required to face one another through the exposure area. It is also preferable to mount the illumination and observation optical systems $L_{Y1}$ and $D_{Y1}$ on one fixing unit $F_{Y1}$ and to mount the illumination and observation optical systems $L_{Y2}$ and $D_{Y2}$ on one fixing unit $F_{Y2}$. The setting of the optical systems around the exposure area EA becomes therefore complicated and the whole system becomes bulky.

In contrast, the position aligning systems shown in FIGS. 17A and 17B can dispose the illumination and observation optical systems on one side of the exposure area EA, simplifying the setting of the optical systems. It is therefore possible to make the whole system compact and facilitate the optical axis adjustment. If the optical axes of the illumination and observation optical systems are made coaxial as shown in FIG. 17B, the optical axis adjustment is not necessary.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A semiconductor substrate comprising:

an exposure plane formed with a position aligning wafer mark having a plurality of edge type or point type scattering sources for scattering incident light, said scattering sources being disposed in a direction perpendicular to a plane of incidence of said incident light, wherein said scattering sources include at least two or more edge type scattering sources whose lengths are not uniform.

2. A semiconductor substrate according to claim 1, wherein at least three scattering sources are disposed in the direction perpendicular to the plane of incidence of said incidence light, the lengths of said scattering sources being not uniform.

3. A semiconductor substrate according to claim 1, wherein a plurality of scattering sources are disposed in the direction parallel to the plane of incidence of said incident light.

4. A semiconductor substrate comprising:

an exposure plane formed with a position aligning wafer mark having a plurality of edge type or point type scattering sources for scattering incident light, said scattering sources being disposed in a direction perpendicular to a plane of incidence of said incident light, wherein at least three scattering sources are disposed in a direction perpendicular to the plane of incidence of said incidence light, the lengths of said scattering sources being non-uniform.

5. A semiconductor substrate according to claim 4, wherein a plurality of scattering sources are disposed in the direction parallel to the plane of incidence of said incident light.

* * * * *